United States Patent
Laursen et al.

(10) Patent No.: US 7,887,396 B2
(45) Date of Patent: *Feb. 15, 2011

(54) METHOD AND APPARATUS FOR CONTROLLED SLURRY DISTRIBUTION

(75) Inventors: Thomas Laursen, Phoenix, AZ (US); Guangying Zhang, Chandler, AZ (US)

(73) Assignee: Novellus Systems, Inc., San Jose, CA (US)

( * ) Notice: Subject to any disclaimer, the term of this patent is extended or adjusted under 35 U.S.C. 154(b) by 263 days.

This patent is subject to a terminal disclaimer.

(21) Appl. No.: 11/276,803

(22) Filed: Mar. 15, 2006

(65) Prior Publication Data

US 2006/0151110 A1 Jul. 13, 2006

Related U.S. Application Data

(63) Continuation of application No. 09/999,401, filed on Nov. 15, 2001, now abandoned.

(51) Int. Cl.
B24B 29/02 (2006.01)

(52) U.S. Cl. .................................. 451/540; 451/541

(58) Field of Classification Search .................. 451/41, 451/60, 285–290, 446, 540, 543, 550, 542
See application file for complete search history.

(56) References Cited

U.S. PATENT DOCUMENTS

| | | | |
|---|---|---|---|
| 5,246,525 A | 9/1993 | Sato | |
| 5,489,233 A * | 2/1996 | Cook et al. | 451/41 |
| 5,650,039 A | 7/1997 | Talieh | |
| 5,709,593 A | 1/1998 | Guthrie et al. | |
| 5,725,420 A * | 3/1998 | Torii | 451/285 |
| 5,816,900 A | 10/1998 | Nagahara et al. | |
| 5,853,317 A | 12/1998 | Yamamoto | |
| 5,857,893 A | 1/1999 | Olsen et al. | |
| 5,876,271 A * | 3/1999 | Oliver | 451/60 |
| 5,882,251 A * | 3/1999 | Berman et al. | 451/527 |
| 5,888,121 A * | 3/1999 | Kirchner et al. | 451/41 |
| 5,984,769 A * | 11/1999 | Bennett et al. | 451/527 |
| 6,051,499 A | 4/2000 | Tolles et al. | |
| 6,056,851 A | 5/2000 | Hsieh et al. | |
| 6,062,964 A * | 5/2000 | Chen et al. | 451/446 |
| 6,099,386 A | 8/2000 | Tsai et al. | |
| 6,113,465 A | 9/2000 | Kim et al. | |
| 6,116,991 A | 9/2000 | Liu et al. | |
| 6,132,078 A | 10/2000 | Lin | |
| 6,135,865 A | 10/2000 | Beardsley et al. | |
| 6,196,907 B1 | 3/2001 | Kahn | |
| 6,238,271 B1 * | 5/2001 | Cesna | 451/41 |
| 6,241,596 B1 * | 6/2001 | Osterheld et al. | 451/527 |

(Continued)

*Primary Examiner*—Maurina Rachuba
(74) *Attorney, Agent, or Firm*—Snell & Wilmer, LLP

(57) ABSTRACT

A method and apparatus for 'through-the-pad' delivery of slurry polishing agents directly to the land areas of a polishing pad is disclosed. The present invention further provides for improved control of the chemical composition of the slurry to address loss of chemical reactivity of the slurry during the polishing cycle. Additionally, various groove modifications to the polishing surface of the pad are also disclosed for improved slurry retention over substantially the entire surface of the polishing pad and reduction of the slow band effect. The present invention thus provides for a higher degree of planarization and uniformity of material removed from the surface of a processed workpiece in order to eliminate, or otherwise reduce, small-scale roughness and large-scale topographic differentials as well as to reduce the Cost-of-Ownership associated with slurry costs.

26 Claims, 19 Drawing Sheets

U.S. PATENT DOCUMENTS

| | | | |
|---|---|---|---|
| 6,273,806 B1 * | 8/2001 | Bennett et al. | 451/527 |
| 6,296,555 B1 | 10/2001 | Inaba et al. | |
| 6,390,891 B1 * | 5/2002 | Guha et al. | 451/41 |
| 6,428,405 B1 * | 8/2002 | Tsuchiya | 451/526 |
| 6,488,570 B1 * | 12/2002 | James et al. | 451/36 |
| 6,513,796 B2 * | 2/2003 | Leidy et al. | 269/21 |
| 6,648,743 B1 * | 11/2003 | Burke | 451/526 |
| 6,918,824 B2 * | 7/2005 | Marquardt et al. | 451/285 |
| 7,285,036 B2 * | 10/2007 | Chang et al. | 451/5 |

* cited by examiner

METHOD AND APPARATUS FOR CONTROLLED SLURRY DISTRIBUTION

CROSS REFERENCE TO RELATED APPLICATION

This application is a continuation of and claims benefit of priority to U.S. Nonprovisional Patent Application No. 09/999,401 filed Nov. 15, 2001, now abandoned, which is herein incorporated by reference in its entirety.

FIELD OF INVENTION

The present invention generally relates to a method and apparatus for polishing or planarizing workpieces such as, for example, semiconductor wafers, magnetic recording discs, and the like. More particularly, the present invention relates to a method and apparatus for controlling slurry distribution in a Chemical Mechanical Planarization process.

BACKGROUND OF THE INVENTION

Many electronic and computer-related products (i.e., semiconductors, computer hard disks, etc.) require highly polished surfaces in order to achieve optimum operational characteristics. Recent growth in the implementation of integrated circuit devices has generally resulted in a corresponding increase in demand for semiconductor wafers from which integrated circuit chips ("IC's") are made. The need for higher density IC's, as well as the need for higher production throughput of IC's on a per-wafer basis, has resulted in a need for increasing the planarity of semiconductor wafer surfaces both during initial production of semiconductor wafers as well as during the actual fabrication of an IC on the wafer surface. This need for increased planarity of semiconductor wafer surfaces presents unresolved challenges in the Chemical Mechanical Planarization ("CMP") art (i.e., Cost-of-Ownership considerations), such as, for example, decreasing the slurry consumption.

The production of IC's generally begins with the creation of high-quality semiconductor wafers. During the IC fabrication process, the wafers typically undergo multiple masking, etching, and deposition process steps. After each deposition, the layer is etched to create circuit component features. Because of the high precision required in the manufacturing of IC's, an extremely planar surface is generally needed on at least one side of the semiconductor wafer to ensure proper accuracy and performance of the microelectronic structures created at the wafer surface.

As multiple circuit layers are iteratively exposed and developed, the outermost surface of the substrate becomes increasingly non-planar. This occurs because the distance between the outer surface and the underlying substrate is greatest in regions of the wafer substrate where the least lithographic etching has occurred, and least in regions where the greatest etching has occurred. With a single circuit-pattern layer, these surface variations comprise a series of peaks and valleys where the vertical differential between the highest peak and lowest valley may be on the order of several thousand Angstroms. With the construction of multiple circuit layers, this vertical differential accumulates and becomes increasingly divergent—reaching several microns and resulting in the production of defective IC devices.

In general the need for highly planar wafer surfaces becomes increasingly important as the size of the IC's decrease and the number of microstructures per IC increase. In order to manufacture ultra-high density IC's, CMP processes are employed to provide a suitably adapted surface that is both highly planar and uniform across substantially the entire surface of the wafer.

An exemplary wafer substrate for lithographic etching of circuit patterns may be constructed by coating a circular, flat, silicon wafer with a film of metal such as aluminum. A layer of photoresist is then placed over the metal layer. A photolithographic apparatus is then typically employed to expose the photoresist to electromagnetic or particle-beam radiation to produce a patterned photoresist layer. Exposed portions of the metal layer are then chemically etched leaving behind circuit component features. The remaining photoresist is then removed to permit further processing.

A second layer of circuit componentry may then be created, for example, by depositing an insulative layer (i.e., silicon dioxide) over the previously developed circuit features. The outer surface of the second insulative layer topologically conforms to the variations created by the etching of the underlying circuit pattern. This creates a series of peaks and valleys on the outermost surface of the second (e.g., dielectric) layer. The resulting complexity and variation of topological features tends to increase with the exposure and etching of multiple component layers.

Photolithographic techniques used to pattern the photoresist typically have a depth of focus of about 0.2 to 0.4 microns for sub-half-micron features. If the photoresist layer is sufficiently non-planar (i.e., if the maximum vertical differential of any peak and any valley on the outer surface is greater than the depth of focus of the imaging device), then it will generally not be possible to properly focus the image onto the wafer to create the pattern for the next layer of componentry. Even where the imaging apparatus may be adapted to accommodate the non-planarity created by any single patterned layer within the range of the device's depth of focus, after the deposition of a sufficient number of circuit layers, the maximum vertical differential will eventually exceed the imaging apparatus' depth of focus and, therefore, compromise its ability to accommodate the non-planarity.

CMP machines have been developed to polish or planarize silicon wafer surfaces to the flat condition desired for manufacture of IC components, and the like. For a general discussion of conventional CMP processes and devices, see U.S. Pat. No. 4,805,348, issued in February 1989 to Arai et al.; U.S. Pat. No. 4,811,522, issued in March 1989 to Gill; U.S. Pat. No. 5,099,614, issued in March 1992 to Arai et al.; U.S. Pat. No. 5,329,732, issued in July 1994 to Karlsrud et al.; U.S. Pat. No. 5,476,890, issued in December 1995 to Masayoshi et al.; U.S. Pat. Nos. 5,498,196 and 5,498,199, both issued in March 1996 to Karlsrud et al.; U.S. Pat. No. 5,558,568, issued in September 1996 to Talieh et al.; and U.S. Pat. No. 5,584,751, issued in December 1996 to Kobayashi et al., all of which are incorporated herein by reference.

Chemical mechanical polishing or planarizing of a surface of an object may be desirable for several reasons. For example, chemical mechanical polishing is often used in the formation of microelectronic devices to provide a substantially smooth, planar surface suitable for subsequent fabrication processes such as photoresist coating and pattern definition. Chemical mechanical polishing may also be used to form microelectronic features. For example, a conductive feature such as a metal line or a conductive plug may be formed on a surface of a wafer by forming trenches and vias on the wafer surface, depositing conductive material over the wafer surface and into the trenches and vias, and removing the conductive material on the surface of the wafer using chemical mechanical polishing, leaving the vias and trenches filled with the conductive material.

A typical chemical mechanical polishing apparatus suitable for planarizing the semiconductor surface generally includes a wafer carrier configured to support, guide, and apply pressure to a wafer during the polishing process; a polishing compound such as a slurry containing abrasive particles and chemicals to assist removal of material from the surface of the wafer; and a polishing surface such as a polishing pad. In addition, the polishing apparatus may include an integrated wafer cleaning system and/or an automated load and unload station to facilitate automatic processing of the wafers.

In an exemplary prior art CMP polishing method, one side of a silicon wafer is attached to a flat surface of a wafer carrier or chuck with the other side of the wafer pressed against a flat polishing pad. In general, the exposed surface of the pad incorporates an abrasive such as, for example, cerium oxide, aluminum oxide, fumed/precipitated silica, or other particulate abrasives, while the underlying support material may be formed of various commercially available compositions such as, for example, a blown polyurethane (i.e., the IC, SUBA IV and GS series of polishing pads available from Rodel Products, Phoenix, Ariz., USA; Cabot Microelectronics, Aurora, Ill., USA; and/or Thomas West, Sunnyvale, Calif., USA) or such other materials that are known in the art.

During the polishing or planarization process, the workpiece (e.g., silicon wafer) is typically pressed against the polishing pad surface while the pad rotates about its principle axis in the presence of a polishing compound. In particular, the wafer is placed in the carrier such that the surface to be polished is placed in contact with the polishing surface and the polishing surface and the wafer are moved relative to each other while slurry is supplied to the polishing surface. Additionally, in order to improve polishing effectiveness, the wafer may also be rotated about its principal axis and oscillated over both the inner and outer radial surfaces of the polishing pad. Moreover, an orbital polisher may be employed to further increase polishing uniformity and effectiveness. The hardness and density of the polishing pad depends on the material that is to be polished and the degree of precision required in the polishing process.

CMP is a fairly complex process that differs substantially from simple wet sanding. In the CMP process, polishing slurry, including an abrasive and at least one chemically reactive agent, is spread on the polishing pad to provide an abrasive chemical solution at the interface between the pad and wafer substrate. The chemically reactive agent in the slurry reacts with the outer surface of the substrate to form reactive sites. The interaction of the polishing pad and abrasive particles with the reactive sites results in polishing of the wafer substrate; that is, Chemical Mechanical Planarization or Polishing occurs when pressure is applied between the polishing pad and the workpiece being polished where the mechanical stresses and the abrasive particles within the slurry create mechanical strain on the chemical bonds on or near the surface being polished, rendering the chemical bonds more susceptible to chemical attack or corrosion (e.g., stress corrosion).

After the mechanical stresses weaken the chemical bonds on the surface of the workpiece, chemical agent(s) in the slurry will attract certain atoms from the workpiece surface, thereby removing part of the surface material (e.g., chemical leaching). Consequently, microscopic regions are selectively removed from the surface being polished, thereby enhancing the planarity of the polished workpiece surface. Very small deviations in the uniformity of the pressure applied to the wafer substrate across the surface of the substrate can result in defects and imperfections in the planarization process. Planarization, however, need only be performed when necessary: (1) to prevent the peak-to-valley differential from exceeding the depth of photolithographic focus; (2) to minimize metal loss (i.e., for Cu and W CMP) in lines and/or vias by avoiding dishing and erosion; or, (3) any time a new layer is deposited over a previously developed circuit layer.

A suitably adapted and effective CMP process may generally be considered as one that provides a high polishing rate which generates a substrate surface that is both finished (e.g., lacks small-scale roughness) and flat (e.g., lacks large-scale topographic differentials). The desired polishing rate, finish and flatness has previously been manipulated, for example, by selection of the pad and slurry combination; the relative speed between the substrate and pad; the force pressing the substrate against the pad; and the method of introducing the slurry to the pad-wafer interface.

An additional consideration in the production of IC's is process/product stability (e.g., quality control). To achieve a high yield (e.g., low defect rate), each developed circuit layer should generally be polished under substantially reproducible conditions so that each IC is substantially indistinguishable from any other IC produced from a different wafer lot. The realization of improved methods for distribution and control of a suitably adapted slurry composition is therefore important.

FIG. 13 shows post-CMP wafer profiles obtained with both a 1501-50 and an SS-12 slurry in a prior art conventional 300 mm CMP process. In comparison to the 1501-based oxide process, lower removal rates and higher non-uniformity were observed with the SS-12-based oxide process. Due to the SS-12 fumed silica particulate abrasive having a larger average cross-sectional diameter, it is generally thought that the. SS-12 slurry exhibits this lower removal rate and higher non-uniformity as a result of difficulties experienced by SS-12 particles in populating the area at the pad-wafer interface during a high pressure CMP polish. A prior art conventional polishing pad (FIG. 12), having X-Y grooving patterns with ¼ inch land-space between grooves and slurry delivery channels located at the intersection of the X-Y grooves, was used. A certain amount of the feed slurry spreads out along the X-Y grooves without participating in the polishing process due to an inability of the slurry to penetrate the grooves to populate the land areas. This is especially the case for slurries delivered through distribution holes which are closer to the edge of the polish pad. Accordingly, an anisotropic distribution of slurry in the peripheral region of the wafer edge is observed for both the 1501 and the SS-12 based processes, which results in what is termed a 'slow band' region as shown, for example, in FIG. 13 from about 120 mm to 150 mm and −120 mm to −150 mm.

Additionally, for Cu processes, it has been observed that slurries on orbital and rotational CMP platforms may demonstrate different polish characteristics as well. For example, polish rates and selectivities to Cu, Ta and TEOS, using the same slurry, can turn out quite differently on any two platforms. Moreover, passivation issues during clearing and re-polishing may yield different results as well. It should also be here noted that feature-scale planarization studies have shown less over-polish sensitivity on the orbital platform.

Several prior art processes have been devised to optimize CMP polish behavior. For example, selectivities have been previously achieved by varying, for example, slurry flow rate, polish pressure and orbit speed; however, such control is generally limited with the same process variables also being used to optimize, for example, the polish rate, uniformity, and planarity parameters.

With respect to polish performance, abrasive-free slurries have demonstrated significantly less Cu and TEOS loss. It is generally considered that 'through-the-pad' delivery of abrasive-free slurries provides for this improved performance; however, even in this case, it would be desirable to have, for example, a substantially independent mechanism for increasing the Cu removal rate.

Presently known polishing techniques are unsatisfactory in several regards. For example, during polishing, the polishing agents may not be deposited evenly over the entire surface of the polishing pad, which can result in dry spots forming on the polishing pad. Consequently, the polishing effect of the pad may rendered non-uniformity across the surface of the workpiece. Additionally, the removal of surface particles from the workpiece tends to significantly alter the chemical composition of the slurry during the polishing cycle. Moreover, the processing of workpieces may require the deposition of multiple polishing agents from multiple sources with each source potentially causing: (1) the polishing agents to distribute differently across the surface of the polishing pad; and (2) unintended cross reaction(s)—further altering the chemical composition of the slurry.

Still another significant consideration with respect to polishing performance is the Cost-of-Ownership. For example, when considering the cost of processing a wafer, consumable costs may be appreciable and often can exceed that of the polishing tool itself. In particular, the cost of polishing slurry may become a matter of some importance. It is therefore desirable to deliver polishing slurry to the polishing surface in as efficient a manner as possible.

In view of the foregoing, there is a need for a method and apparatus which optimizes polishing throughput while providing for improved surface planarity and finish by controlling: (1) the chemistry of the slurry composition at any given time in the polishing cycle; and (2) the distribution of the slurry to the land areas of a polishing pad to permit a higher degree of planarization and uniformity of material removed over substantially the entire surface of a processed workpiece.

SUMMARY OF THE INVENTION

In accordance with various aspects of the present invention, the invention provides a method and apparatus for 'through-the-pad' delivery of slurry polishing agents distributed from multiple sources to the land areas of a polishing pad in order to overcome many of the shortcomings of the prior art, such as, uneven and/or non-uniform processing of workpiece surfaces. The present invention further provides for improved control of the chemical composition of the slurry to address loss of chemical reactivity of the slurry during the polishing cycle due to, for example: (1) chemical leaching of material away from the polished substrate; (2) stress corrosion; and/or (3) cross reactions that may occur between chemically reactive slurry components.

In accordance with one aspect of the present invention, slurry delivery channels are configured to distribute polishing slurry through the land areas of a polishing pad whereby slurry is introduced directly to the pad-wafer interface. Additionally, various groove modifications to the polishing surface of the pad are disclosed for: (1) improved control of the retention time experienced by the slurry at the pad-wafer interface; and (2) to reduce the anisotropy of land-area slurry retention at peripheral regions of the polishing pad caused by conventional X-Y groove patterns.

In accordance with another aspect of the present invention, X-Y grooves may be preferably used as drain paths for chemical by-products and polishing waste material, while slurry delivery through the land areas of the pad is employed to introduce a fresh supply of reactive slurry having a chemical composition substantially similar to that of pre-polish slurry.

In accordance with a further aspect of the present invention, the number of slurry delivery channels (both in the land areas and in the X-Y grooves), and the flow rates to the same, are optimized to provide means for selectively controlling slurry chemistry at the pad-wafer interface during a polishing cycle. Moreover, various non-reactive slurry components may be independently distributed to various delivery channels, whereby the non-reactive slurry components experience 'point-of-use' mixing to generate a locally reactive slurry compound or admixture, wherein the appearance of unintended slurry cross reaction by-products, that might otherwise occur with mixing of the non-reactive components prior to delivery to the pad-wafer interface, is reduced.

Previous slurry delivery systems deliver slurry to pad grooves thereby diverting slurry flow along the grooves without substantial introduction to the pad-wafer interface where polishing takes place. Reduction of the number of grooves and the feeding of slurry substantially directly to the land areas of the polishing pad virtually eliminates or otherwise dramatically reduces diversion of slurry components from the pad-wafer interface. The present invention thus provides significant advantages in slurry delivery at low flow rates in a process that maintains a high polish rate. Moreover, the present invention operates to lower the Cost-of-Ownership with the reduction of polishing slurry cost.

The present invention additionally provides for improved control of: (1) the chemistry of the slurry composition at any given time in the polishing cycle; and (2) the distribution of the slurry to the land areas of the polishing pad to permit a higher degree of planarization and uniformity of material removed over substantially the entire surface of a processed workpiece. Moreover, the method and apparatus so disclosed may be applied to orbital, rotational as well as linear CMP polishing processes.

Additional advantages of the present invention will be set forth in the detailed description which follows, and in part will be obvious from the detailed description, or may be learned by practice of the invention. The objects and advantages of the invention may be realized by means of the instrumentalities, methods and combinations particularly pointed out in the claims.

BRIEF DESCRIPTION OF THE DRAWINGS

The features and advantages of the present invention reside inter alia in the details of construction and operation as more fully hereinafter depicted, described and claimed; reference being had to the accompanying drawings forming a part hereof, wherein like numerals refer to like parts throughout. Other features and advantages will become apparent to those skilled in the art in light of certain exemplary embodiments recited in the detailed description of the drawings, wherein:

Figure 1:
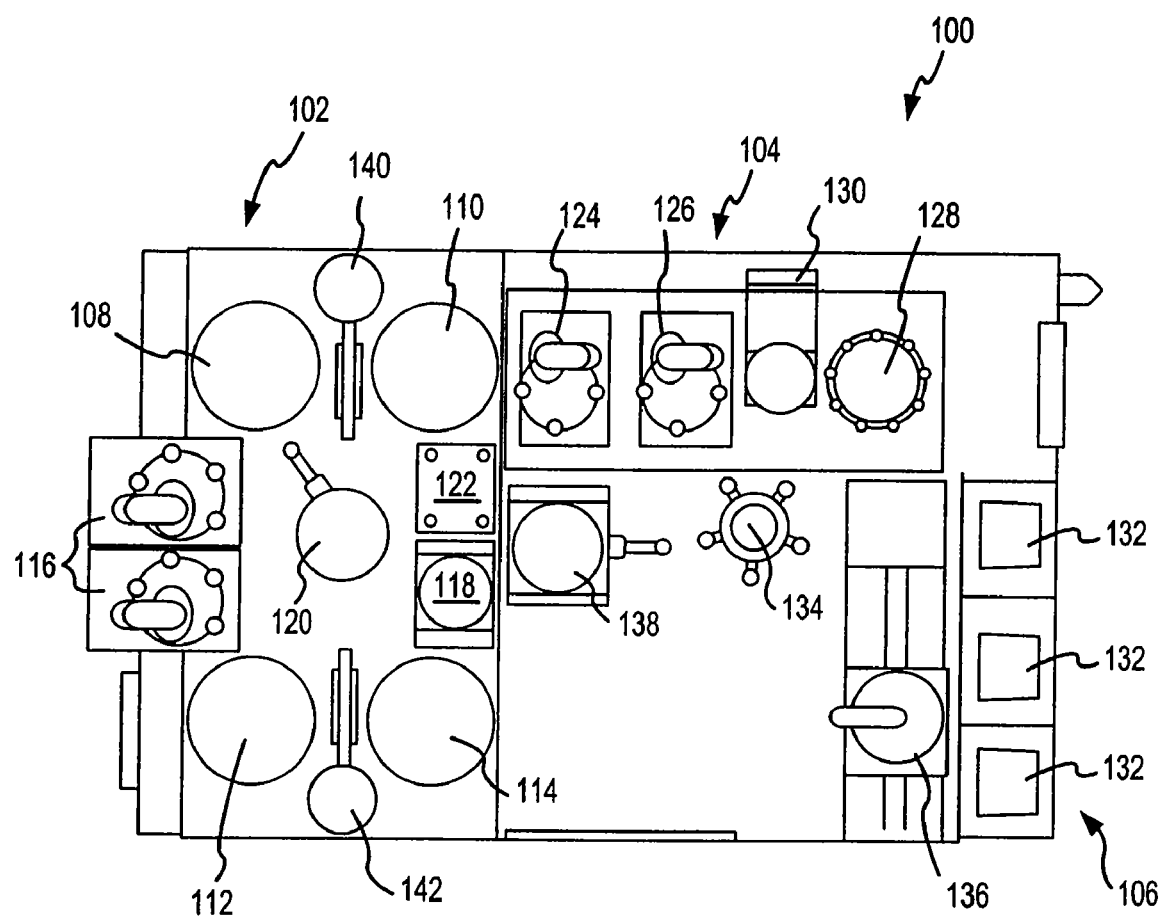
FIG. 1 illustrates a top cut-away view of an exemplary polishing system in accordance with the present invention.

Those skilled in the art will appreciate that elements in the figures are illustrated for simplicity and clarity and have not necessarily been drawn to scale. For example, the dimensions of some of the elements in the figures may be exaggerated relative to other elements to help improve understanding of various embodiments of the present invention.

DETAILED DESCRIPTION

The following descriptions are of exemplary embodiments of the invention and the inventors' conception of the best mode, and are not intended to limit the scope, applicability or configuration of the invention in any way. Rather, the following description is intended to provide convenient illustrations for implementing various embodiments of the invention. As will become apparent, various changes may be made in the function and arrangement of the elements described in these embodiments without departing from the spirit and scope of the invention. Various exemplary implementations of the present invention may be applied to any polishing process utilizing chemically reactive slurry polishing agents. Certain representative implementations may include, for example, the polishing and/or planarization of: semiconductor wafers; integrated circuit wafers; magnetic data storage media, including computer hard drives and other magnetic mass storage media; optical data storage media including CD-ROM's, DVD's and other optical mass storage media; optical waveguides; interferometric components; electromagnetic detectors and any other object having a surface requiring a high degree of planarity. As used herein, the terms "planarity" and "even surface", or any variation thereof, are intended to denote anything that is currently susceptible to being characterized as having: (1) reduced small-scale surface defects; and (2) minimal large-scale topographic differentials, or anything that may hereafter lend itself to the same or similar characterization. The same shall properly be regarded as within the scope and ambit of the present invention. By way of example, a detailed description of an exemplary application, namely the planarization of silicon wafers in the fabrication of integrated circuits, is provided as a specific enabling disclosure that may be generalized by those skilled in the art to any application of the disclosed method and apparatus for the control of slurry chemistry and slurry distribution in accordance with the present invention.

In accordance with one exemplary aspect, the subject invention relates to a process of removing thin film layers during polishing of, for example, a semiconductor wafer. The preferred embodiment set forth herein relates to a method and apparatus for optimizing the global uniformity of a semiconductor wafer as well as the planarity within, for example, an individual IC die structure. It will be appreciated, however that the principles of the present invention may be employed to ascertain and/or realize any number of other benefits associated with the planarization of a workpiece surface, including, but not limited to, the improvement of product yield and/or the reduction of Cost-of-Ownership.

FIG. 1 illustrates a top cut-way view of a polishing apparatus 100, suitable for removing material from a surface of a workpiece, in accordance with one exemplary embodiment of the present invention. Apparatus 100 includes a multi-platen polishing system 102, a clean system 104, and a wafer load and unload station 106. In addition, apparatus 100 includes a cover (not illustrated) that surrounds apparatus 100 to isolate apparatus 100 from the surrounding environment. In accordance with a preferred exemplary embodiment of the present invention, polishing machine 100 is a Momentum machine available from SpeedFam-IPEC Corporation of Chandler, Ariz., USA. However, machine 100 may be any machine capable of removing material from a workpiece surface.

Although the present invention may be used to remove material from the surfaces of a variety of workpieces such as magnetic discs, optical discs, and the like, the invention is conveniently described below in connection with removing material from a surface of a wafer. In the context of the present invention, the term "wafer" shall mean any semiconductor substrate, which may include layers of insulating, semiconducting, and conducting layers or features formed thereon, used to manufacture microelectronic devices and the like.

Exemplary polishing system 102 includes four polishing stations 108, 110, 112, and 114, which each operate independently; a buff station 116; a transition stage 118; a robot 120; and optionally, a metrology station 122. Polishing stations 108-114 may be configured as desired to perform specific functions; however, in accordance with the present invention, at least one of stations 108-114 includes an apparatus for 'through-the-pad' delivery of slurry polishing agents directly to the land areas of a polishing pad as described herein. The remaining polishing stations may be configured for chemical mechanical polishing, electrochemical polishing, electrochemical deposition, or the like.

Polishing system 102 may also include polishing surface conditioners 140, 142. The configuration of conditioners 140, 142 generally depends on the type of polishing surface to be conditioned. For example, when the polishing surface comprises a polyurethane polishing pad, conditioners 140, 142 suitably include a rigid substrate coated with, for example, diamond material. Various other surface conditioners may also be used in accordance with the present invention.

Clean system 104 is generally configured to remove debris such as slurry residue and material removed from the wafer surface during polishing. In accordance with the illustrated embodiment, system 104 includes clean stations 124 and 126, a spin rinse dryer 128, and a robot 130 configured to transport the wafer between clean stations 124, 126 and spin rinse dryer 128. In accordance with one exemplary aspect of this embodiment, each clean station 124 and 126 includes two concentric circular brushes, which contact the top and bottom surfaces of a wafer during a clean process.

Wafer load and unload station 106 is configured to receive dry wafers for processing in cassettes 132. In accordance with one exemplary embodiment of the present invention, the wafers are dry when loaded onto station 106 and are dry before return to station 106.

In accordance with an alternate exemplary embodiment of the invention, clean system 104 may be separate from the polishing apparatus. In this case, load station 106 is configured to receive dry wafers for processing, and the wafers are held, for example, in a wet environment (e.g., de-ionized water) until the wafers are transferred to the clean station.

In exemplary operation, cassettes 132, which may include one or more wafers, are loaded onto apparatus 100 at station 106. A wafer from one of cassettes 132 is transported to a stage 134 using a dry robot 136. A wet robot 138 retrieves the wafer at stage 134 and transports the wafer to metrology station 122 for film characterization or to stage 118 within polishing system 102. In this context, a "wet robot" means any automation equipment configured to transport wafers that have been exposed to a liquid or that may have liquid remaining on the wafer and a "dry robot" means any automation equipment configured to transport wafers that are substantially dry. Robot 120 picks up the wafer from metrology station 122 or stage 118 and transports the wafer to one of polishing stations 108-114 for chemical mechanical polishing.

After polishing, the wafer is transferred to buff station 116 to further polish the surface of the wafer. The wafer is then transferred (optionally to metrology station 122 and) to stage 118, which keeps the wafers in a wet environment, for pickup by robot 138. Once the wafer is removed from the polishing surface, conditioners 140,142 may be employed to condition the polishing surface. Conditioners 140, 142 may also be employed prior to polishing a wafer to prepare the surface for wafer polishing.

After a wafer is placed in stage 118, robot 138 picks up the wafer and transports the wafer to clean system 104. In particular, robot 138 transports the wafer to robot 130, which in turn places the wafer in one of clean stations 124, 126. The wafer is cleaned using one or more stations 124, 126 and is then transported to spin rinse dryer 128 to rinse and dry the wafer prior to transporting the wafer to load and unload station 106 using robot 136.

Figure 2:
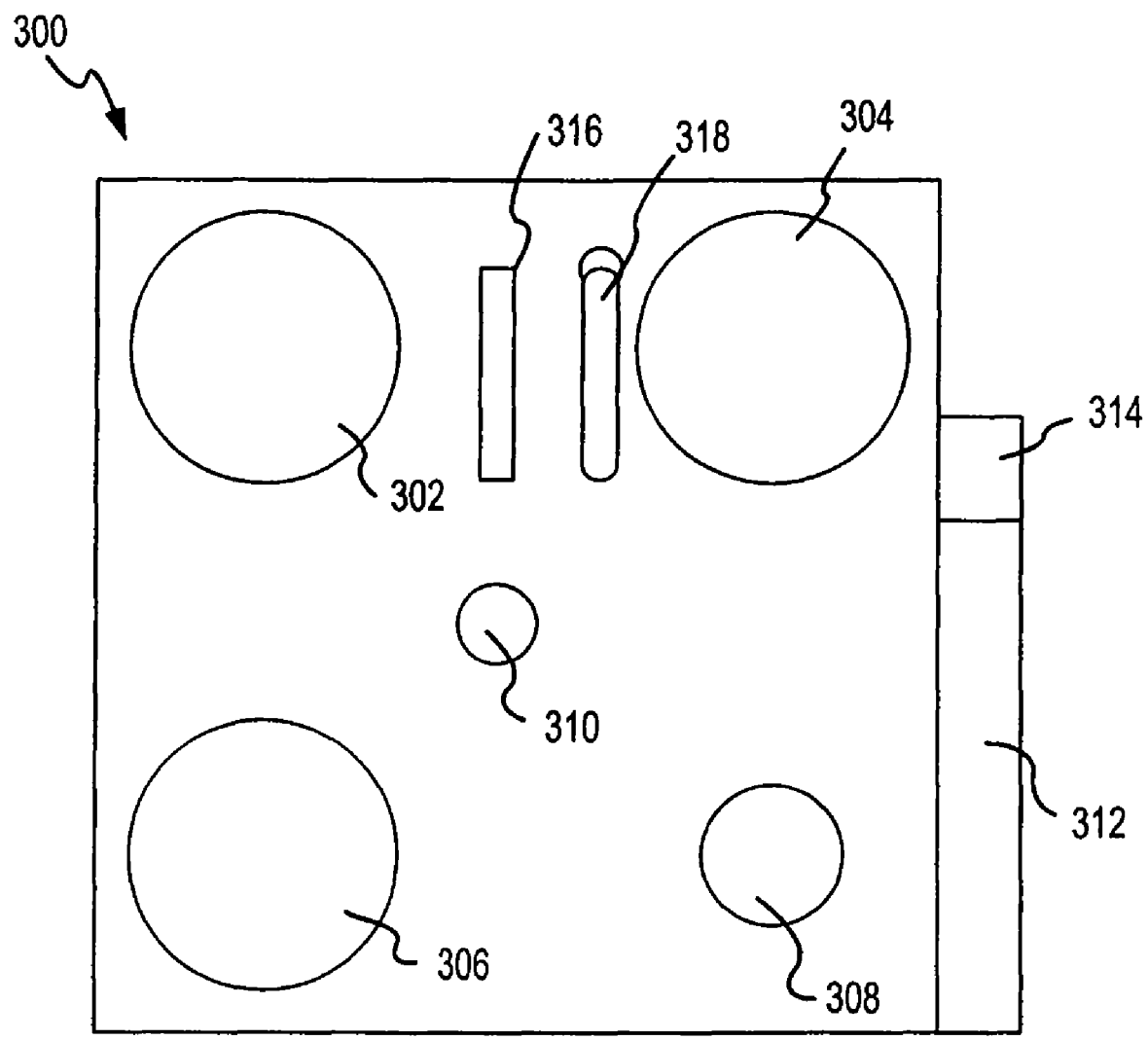
FIG. 2 illustrates a top cut-away view of an exemplary polishing system in accordance with another embodiment of the invention.
Figure 3:
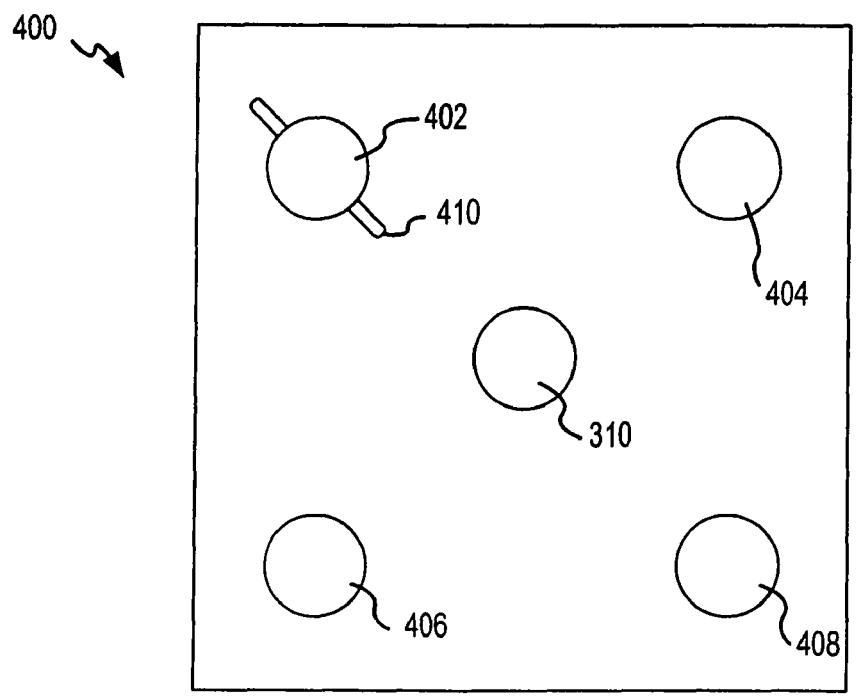
FIG. 3 illustrates a bottom view of an exemplary carrier carousel for use with the apparatus illustrated in FIG. 2.

FIG. 2 illustrates a top cut-away view of another exemplary polishing apparatus 300, configured to remove material from a wafer surface. Apparatus 300 is suitably coupled to carousel 400, illustrated for example in FIG. 3, to form an automated chemical mechanical polishing system. A chemical mechanical polishing system in accordance with this exemplary embodiment may also include a removable cover (not illustrated in the figures) overlying apparatus 300 and 400.

Apparatus 300 may be configured, in one exemplary embodiment, to include three polishing stations 302, 304, and 306, a wafer transfer station 308, a center rotational post 310, which is coupled to carousel 400, and which operatively engages carousel 400 to cause carousel 400 to rotate, a load and unload station 312, and a robot 314 configured to transport wafers between stations 312 and 308. Furthermore, apparatus 300 may include one or more rinse washing stations 316 to rinse and/or wash a surface of a wafer before or after a polishing process and one or more pad conditioners 318. Although illustrated with three polishing stations, apparatus 300 may include any desired number of polishing stations and one or more of such polishing stations may be used to buff a surface of a wafer as described herein. Furthermore, apparatus 300 may include an integrated wafer clean and dry system similar to system 104 described above.

Wafer transfer station 308 is generally configured to stage wafers before or between polishing processes and to load and unload wafers from wafer carriers described below. In addition, station 308 may be configured to perform additional functions such as washing the wafers and/or maintaining the wafers in a wet environment.

In one embodiment, carousel apparatus 400 includes polishing heads 402, 404, 406, and 408, each configured to hold, for example, a single wafer. In accordance with one embodiment of the invention, three of carriers 402-408 are configured to retain and urge the wafer against a polishing surface (e.g., a polishing surface associated with one of stations 302-306) and one of carriers 402-408 is configured to transfer a wafer between a polishing station and stage 308. Each carrier 402-408 is suitably spaced from post 310, such that each carrier aligns with a polishing station or station 308. In accordance with one embodiment of the invention, each carrier 402-408 is attached to a rotatable drive mechanism using a gimbal system (not illustrated), which allows carriers 402-408 to cause a wafer to rotate (e.g., during a polishing process). In addition, the carriers may be attached to a carrier motor assembly that is configured to cause the carriers to translate—e.g., along tracks 410. In accordance with one aspect of this embodiment, each carrier 402-408 rotates and translates substantially independently of the other carriers.

In exemplary operation, wafers are processed using apparatus 300 and 400 by loading a wafer onto station 308, from station 312, using robot 314. When a desired number of wafers are loaded onto the carriers, at least one of the wafers is placed in contact with a polishing surface. The wafer may be positioned by lowering a carrier to place the wafer surface in contact with the polishing surface or a portion of the carrier (e.g., a wafer holding surface) may be lowered, to position the wafer in contact with the polishing surface. After polishing is complete, one or more conditioners—e.g., conditioner 318, may be employed to condition the polishing surfaces.

Figure 4:
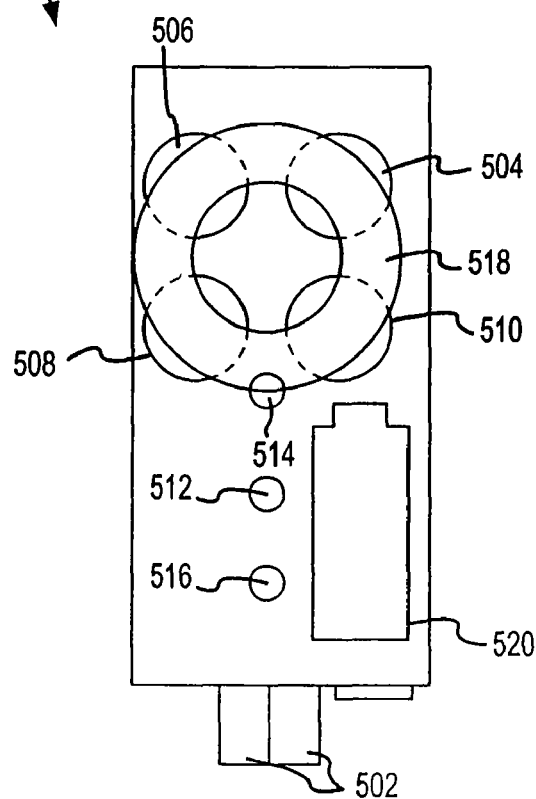
FIG. 4 illustrates a top cut-away view of an exemplary polishing system in accordance with yet another embodiment of the invention.

FIG. 4 illustrates another exemplary polishing system 500 in accordance with one embodiment of the present invention. System 500 is suitably configured to receive a wafer from a cassette 502 and return the wafer to the same or to a predetermined different location within a cassette in a clean, dry state. System 500 includes, for example, polishing stations 504 and 506, a buff station 508, a head loading station 510, a transfer station 512, a wet robot 514, a dry robot 516, a rotatable index table 518, and a clean station 520.

Figure 5:
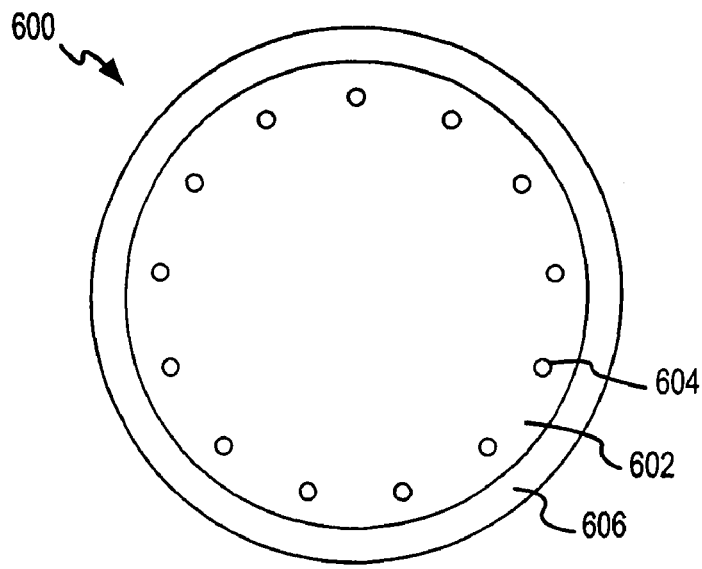
FIG. 5 illustrates a bottom view of an exemplary carrier for use with the system of FIG. 4.

During an exemplary polishing process, a wafer is held in place by a carrier 600, illustrated for example in FIG. 5. Carrier 600 includes a receiving plate 602, including one or more apertures 604, and a retaining ring 606. Apertures 604 are designed to assist retention of a wafer by carrier 600 by, for example, allowing a vacuum pressure to be applied to a back side of the wafer or by creating enough surface tension to retain the wafer. Retaining ring 606 limits the movement of the wafer during the polishing process.

In operation, dry robot 516 unloads a wafer from a cassette 502 and places the wafer on transfer station 512. Wet robot 514 retrieves the wafer from station 512 and places the wafer on loading station 510. The wafer then travels to polishing stations 504-508 for polishing and returns to station 510 for unloading by robot 514 to station 512. The wafer is then transferred to clean system 520 to clean, rinse, and dry the wafer before the wafer is returned to load and unload station 502 using dry robot 516.

Figure 6:
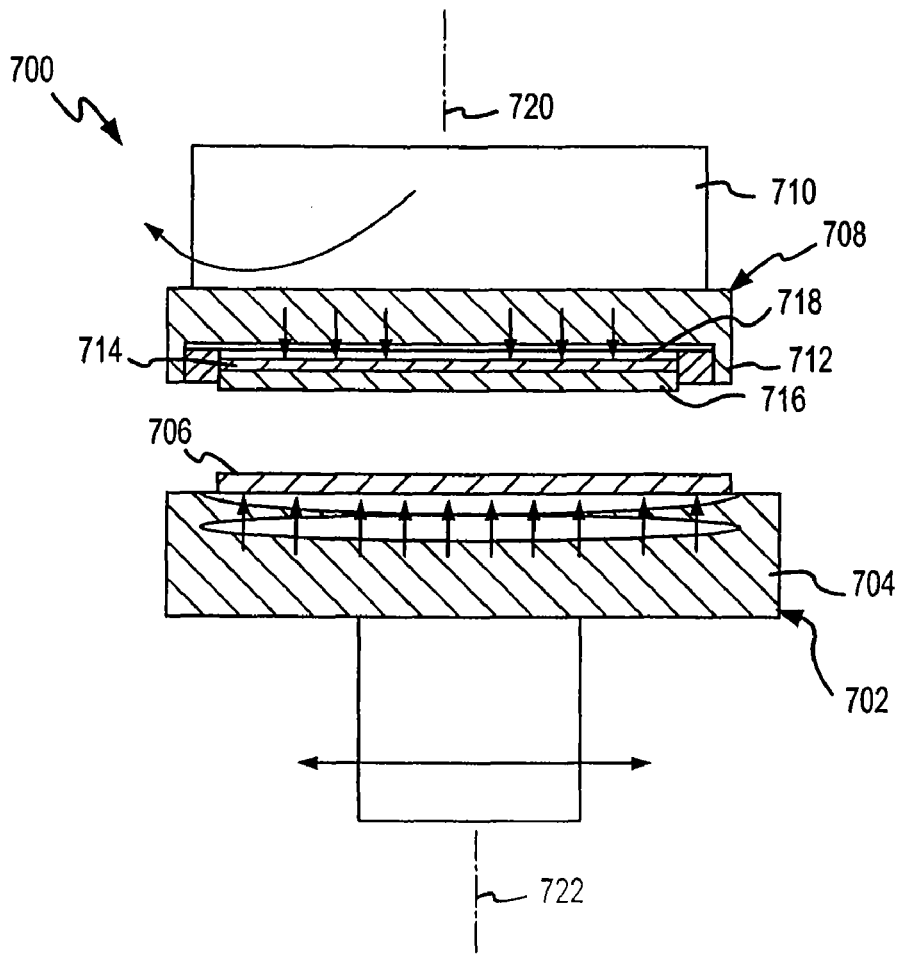
FIG. 6 illustrates a cross-sectional view of an exemplary polishing apparatus in accordance with one embodiment of the present invention.
Figure 10:
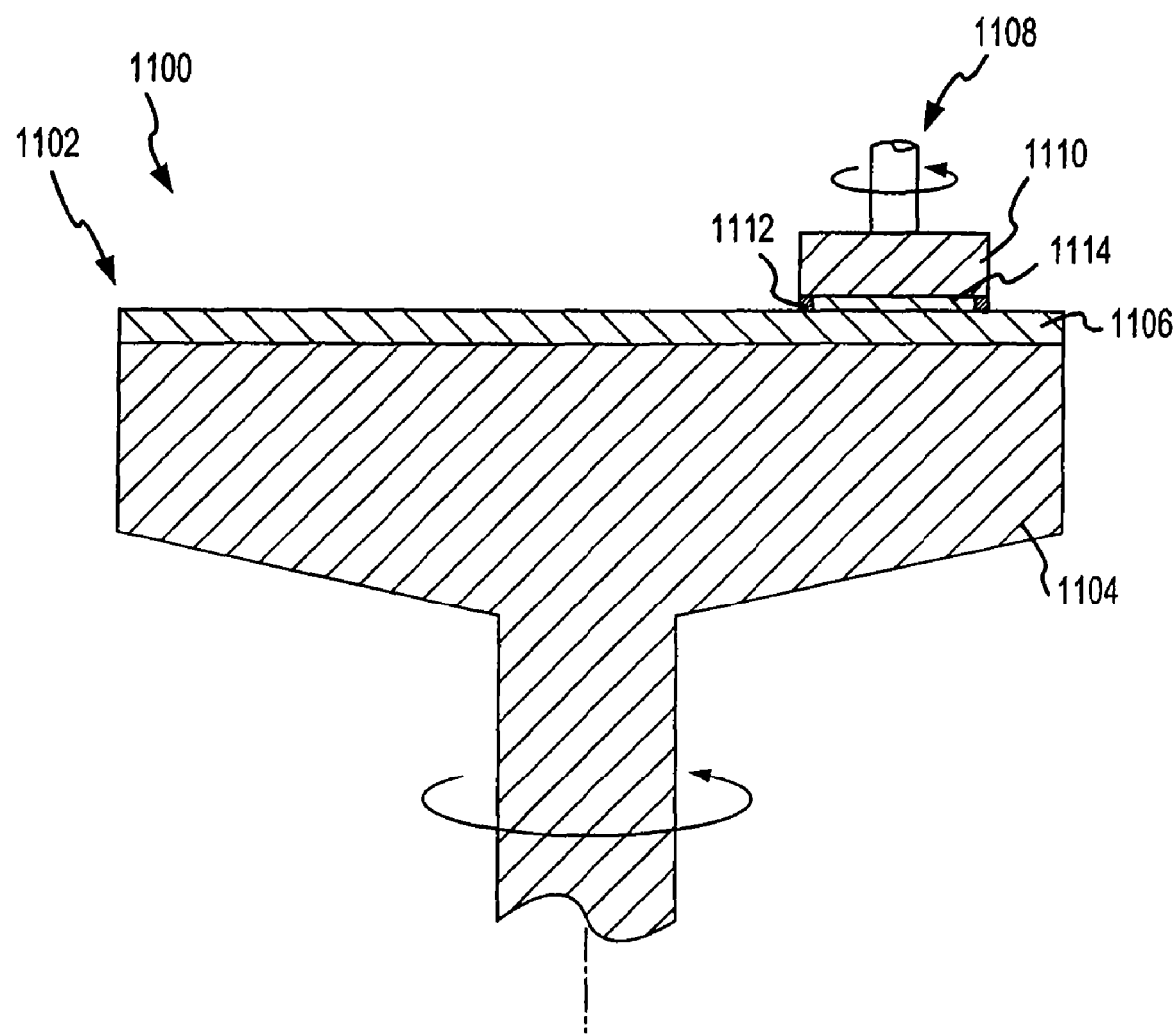
FIG. 10 illustrates a top cut-away view of an exemplary polishing apparatus in accordance with another embodiment of the invention.
Figure 11:
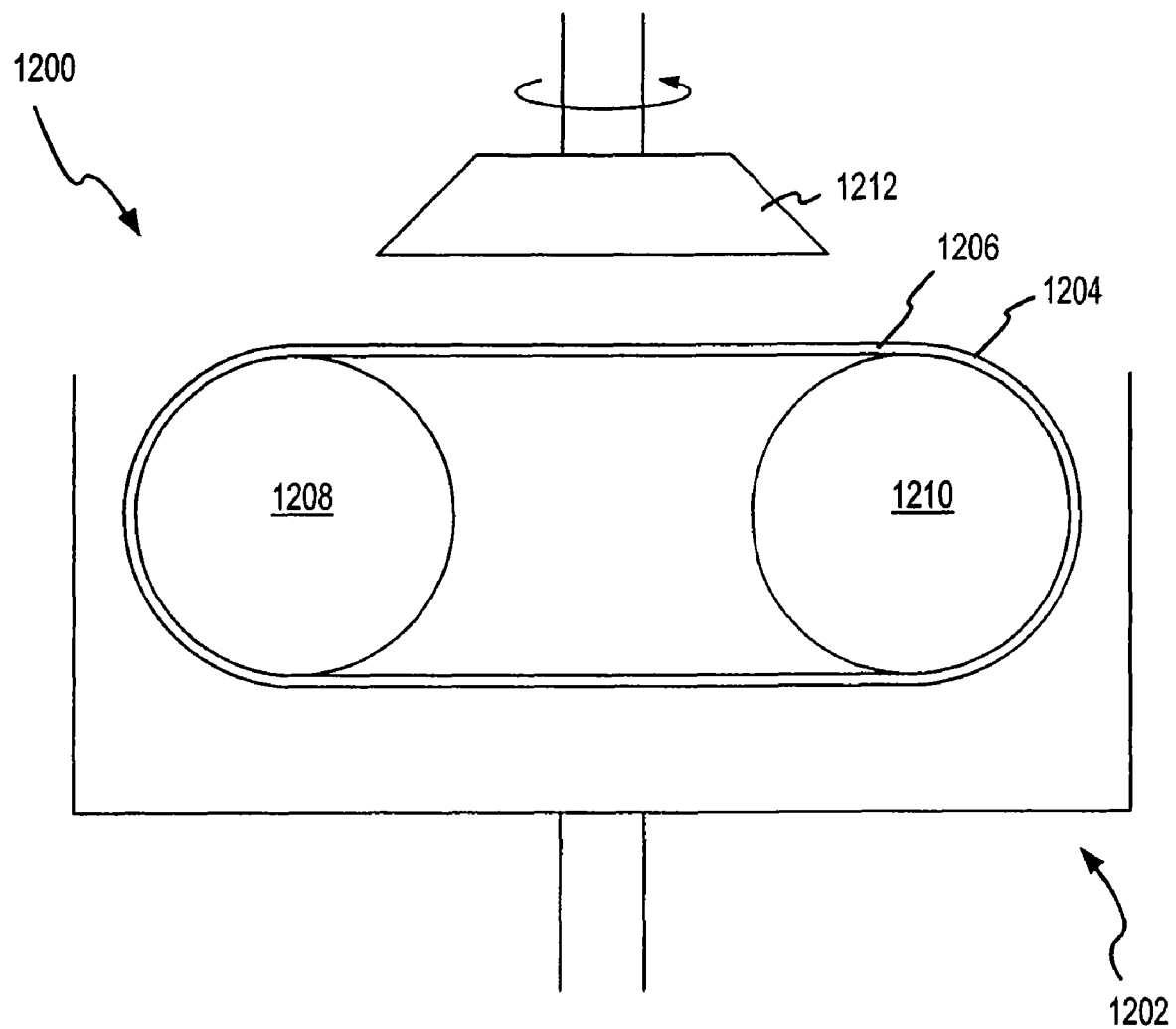
FIG. 11 illustrates a cross-sectional view of an exemplary polishing apparatus in accordance with yet another embodiment of the invention.

FIGS. 6, 10, and 11 illustrate exemplary devices suitable for polishing stations (e.g., polishing stations 108-114, 302-306, and 504-508) in accordance with various embodiments of the present invention. In accordance with various alternative exemplary embodiments of the invention, systems such as apparatuses 100, 300, and 500 may include one or more of the polishing devices described below, and if the system includes more than one polishing station, the system may include any combination of polishing apparatus, including at least one polishing apparatus described herein.

FIG. 6 illustrates a cross-sectional view of a polishing apparatus 700 suitable for polishing a surface of a wafer in accordance with an exemplary embodiment of the invention. Apparatus 700 includes, for example, a lower polish module 702, including a platen 704 and a polishing surface 706 and an upper polish module 708, including a body 710 and a retaining ring 712, which retains the wafer during polishing.

Upper polish module or carrier 708 is generally configured to receive a wafer for polishing and urge the wafer against the polishing surface during a polishing process. In accordance with one embodiment of the invention, carrier 708 is configured to receive a wafer, apply a vacuum force (e.g., about 55 to about 70 cm Hg at sea level) to the backside of wafer 716 to retain the wafer, move in the direction of the polishing surface to place the wafer in contact with polishing surface 706, release the vacuum, and apply a force (e.g., about 0 to about 8 psi) in the direction of the polishing surface. In addition, carrier 708 is configured to cause the wafer to move. For example, carrier 708 may be configured to cause the wafer to move in a rotational, orbital, or translational direction. In accordance with one exemplary aspect of this embodiment, carrier 708 is configured to rotate at about 2 rpm to about 20 rpm about an axis 720.

Carrier 708 also includes, for example, a resilient film 714 interposed between a wafer 716 and body 710 to provide a cushion for wafer 716 during a polishing process. Carrier 708 may also include an air bladder 718 configured to provide a desired, controllable pressure to a back side of the wafer during a polishing process. In this case, the bladder may be divided into zones such that various amounts of pressure may be independently applied to each zone so that the carrier includes multiple pressure zones.

Lower module 702 may be configured to cause the polishing surface to rotate, translate, orbit, or any combination thereof. In accordance with one embodiment of the invention, lower module 702 is configured such that platen 704 orbits with a radius of about 0.25 to about 1 inch, about an axis 722 at about 30 to about 700 orbits per minute, while simultaneously causing the platen 704 to dither or partially rotate. In this case, material is removed primarily from the orbital motion of module 704. Causing the polishing surface to move in an orbital direction is advantageous because it allows a relatively constant speed between the wafer surface and the polishing surface to be maintained during a polishing process. Thus, material removal rates are relatively constant across the wafer surface.

Polishing devices, including for example orbiting lower modules 702, are additionally advantageous because they require relatively little space compared to rotational polishing modules described herein. In particular, because a relatively constant velocity between the wafer surface and the polishing surface can be maintained across the wafer surface by moving the polishing surface in an orbital motion, the polishing surface can be about the same size as the surface to be polished. For example, a diameter of the polishing surface may be about 0.5 inches greater than the diameter of the wafer.

Figure 7:
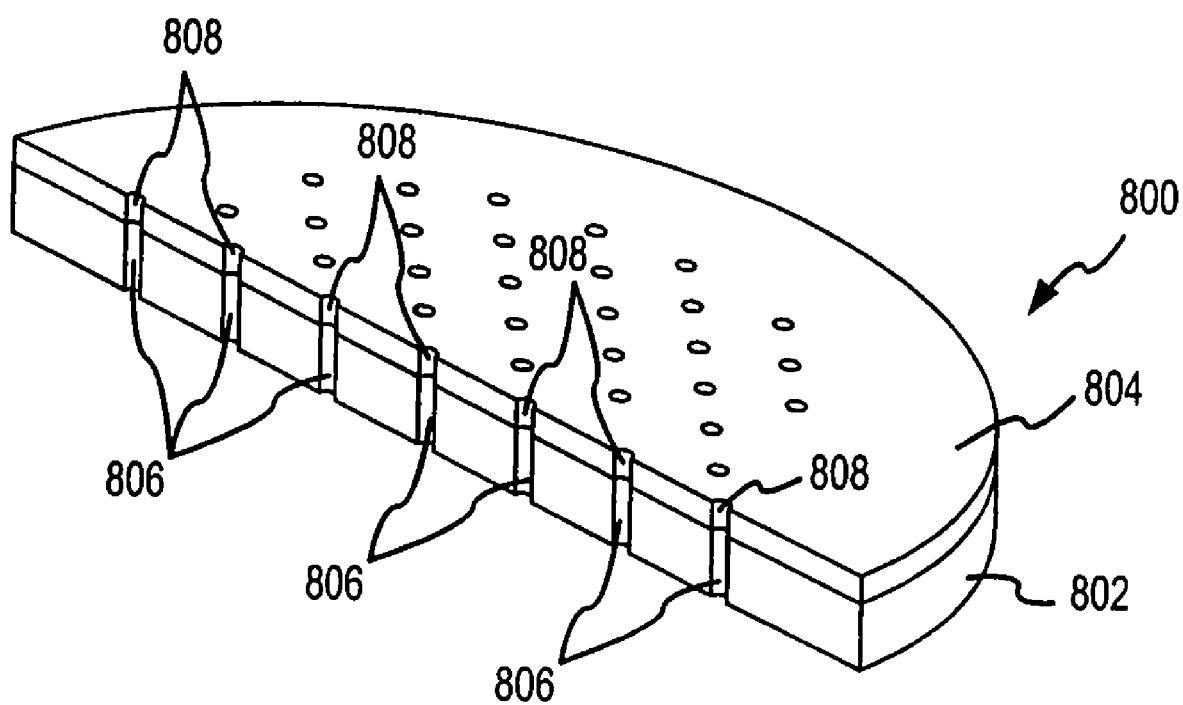
FIG. 7 illustrates an exemplary portion of the polishing apparatus of FIG. 6 in greater detail.

FIG. 7 illustrates a portion of an exemplary lower polishing module 800, including a platen 802 and a polishing surface 804, suitable for use with polishing apparatus 700. Platen 802 and polishing surface 804 include channels 806 and 808 formed therein to allow polishing fluid such as slurry to flow through platen 802 and surface 804 toward a surface of the wafer during the polishing process. Flowing slurry toward the surface of the wafer during the polishing process is advantageous because the slurry acts as a lubricant and thus reduces friction between the wafer surface and polishing surface 804. In addition, providing slurry through the platen and toward the wafer facilitates distribution of the slurry across the surface of the wafer, which in turn facilitates improved material removal from the wafer surface.

Figure 8A:
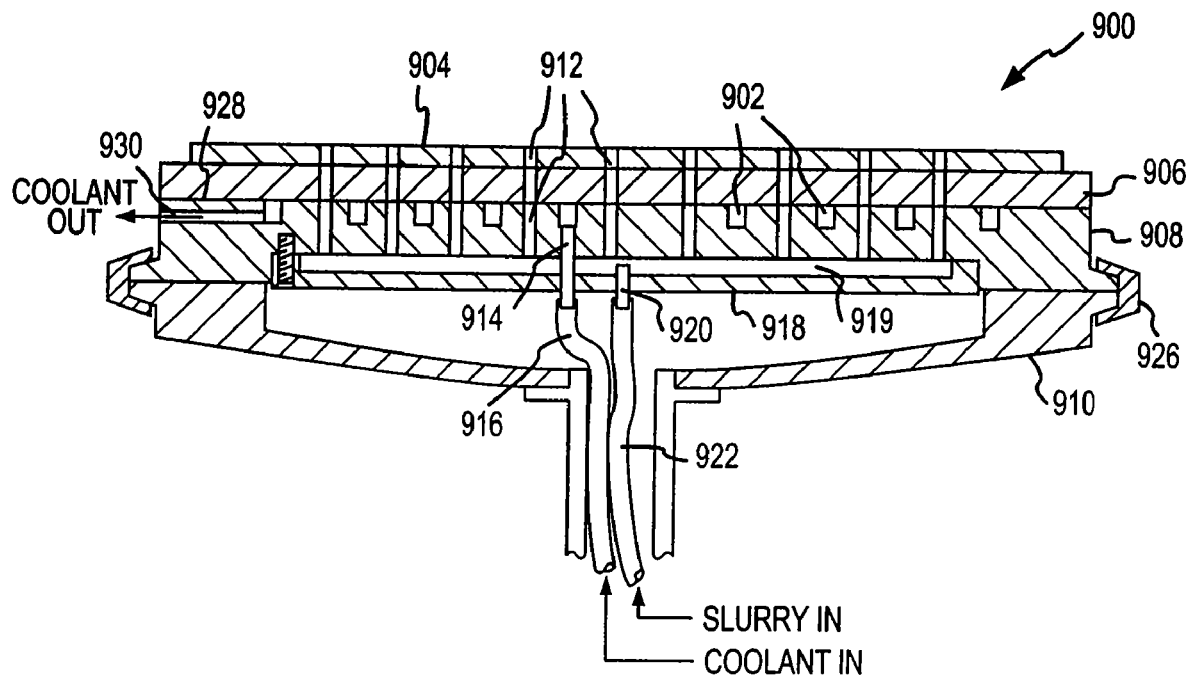
FIGS. 8A and 8B illustrate an exemplary platen including heat exchange channels in accordance with one embodiment of the present invention.
Figure 8B:
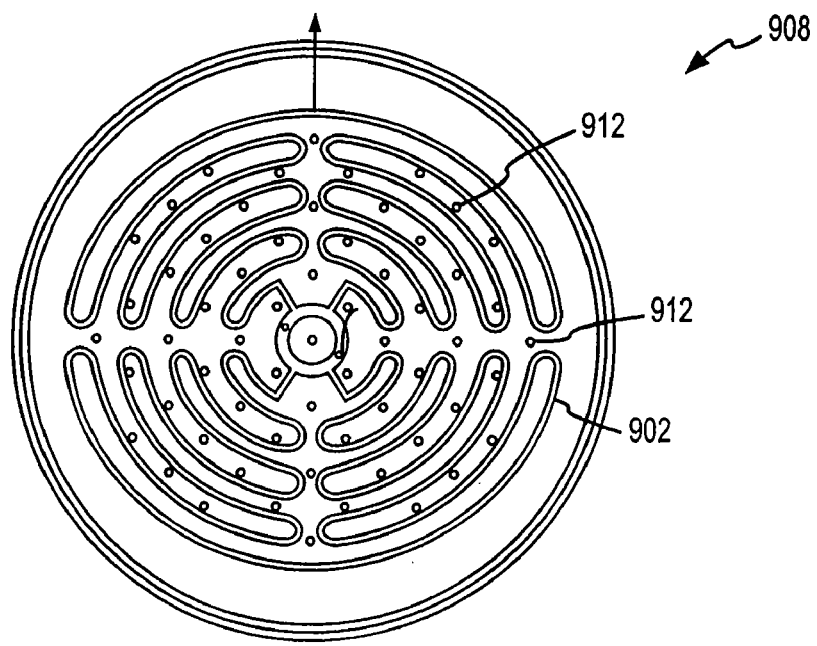

FIGS. 8A and 8B illustrate a portion of an exemplary lower polish module 900 in accordance with yet another embodiment of the invention. Structure or polish head 900 includes a fluid channel 902 to allow heat exchange fluid such as ethylene glycol and/or water to flow therethrough to cool a surface of a polishing surface 904 such as a polishing pad. Module 900 is suitably formed of material having a high thermal conduction coefficient to facilitate control of the processing temperature.

Lower polish head 900 includes a top plate 906, a channel plate 908, and a base plate or bell housing 910, which are coupled together to form polish head 900. Top plate 906 includes a substantially planar top surface to which a polishing surface 904 such as a polishing pad is attached—e.g., using a suitable adhesive. Channel section 908 includes channel 902 to allow heat exchange fluid to flow through a portion of polish head 900. Bottom section 910 is configured for attachment of the polish head to a platen shaft. To allow slurry circulation through polish head 900, cover plate 906, channel section 908, and bottom plate 910 each include channels 912 similar to channels 806 and 808, illustrated, for example, in FIG. 7, through which a polishing solution may flow. In accordance with one exemplary embodiment of the invention, top plate 908 is brazed to channel section 908 and the combination of top plate 906 and channel plate 908 is coupled to, for example, lower plate 910 using clamp ring 926, or alternatively another suitable attachment mechanism such as bolts.

Heat exchange fluid is delivered to polish head 900 through a fluid delivery conduit 914 and a flexible fluid delivery tube 916. Fluid circulates through channel 902 and exits at outlet 930. Slurry is distributed to polish head 900 using, for example, a flexible slurry delivery tube 922 and a slurry delivery conduit 920 to deliver the slurry to a slurry chamber 919. Slurry is then distributed to the land areas of polish head 900 in accordance with various exemplary embodiments of the present invention describe hereinafter. In accordance with one exemplary aspect of this embodiment, slurry chamber 919 is formed by securing a slurry manifold cover 918 to a lower surface of channel section 908.

In an alternative embodiment, the channel groove is formed in the underside of the cover plate. The channel groove may be sealed by attaching a circular disk having a planar top surface to the underside of the cover plate. The bottom section is attached to the circular disk, or, alternatively, the junction of the circular disk and the bottom section could be combined. In either this case or the illustrated case, a channel groove through which a heat exchange fluid can be circulated is formed beneath the substantially planar surface of the platen assembly.

In accordance with yet another embodiment of the invention, the temperature of the polishing process may be controlled by providing a heat exchange fluid to the back side of a wafer. Devices for exposing a heat exchange fluid to the back side of a wafer are well known in the art. For an example of an apparatus configured to regulate the polishing rate of a wafer by back side heat exchange, see U.S. Pat. No. 5,605,488, issued to Ohashi et al. on Feb. 25, 1997, which patent is hereby incorporated by reference.

Figure 9:
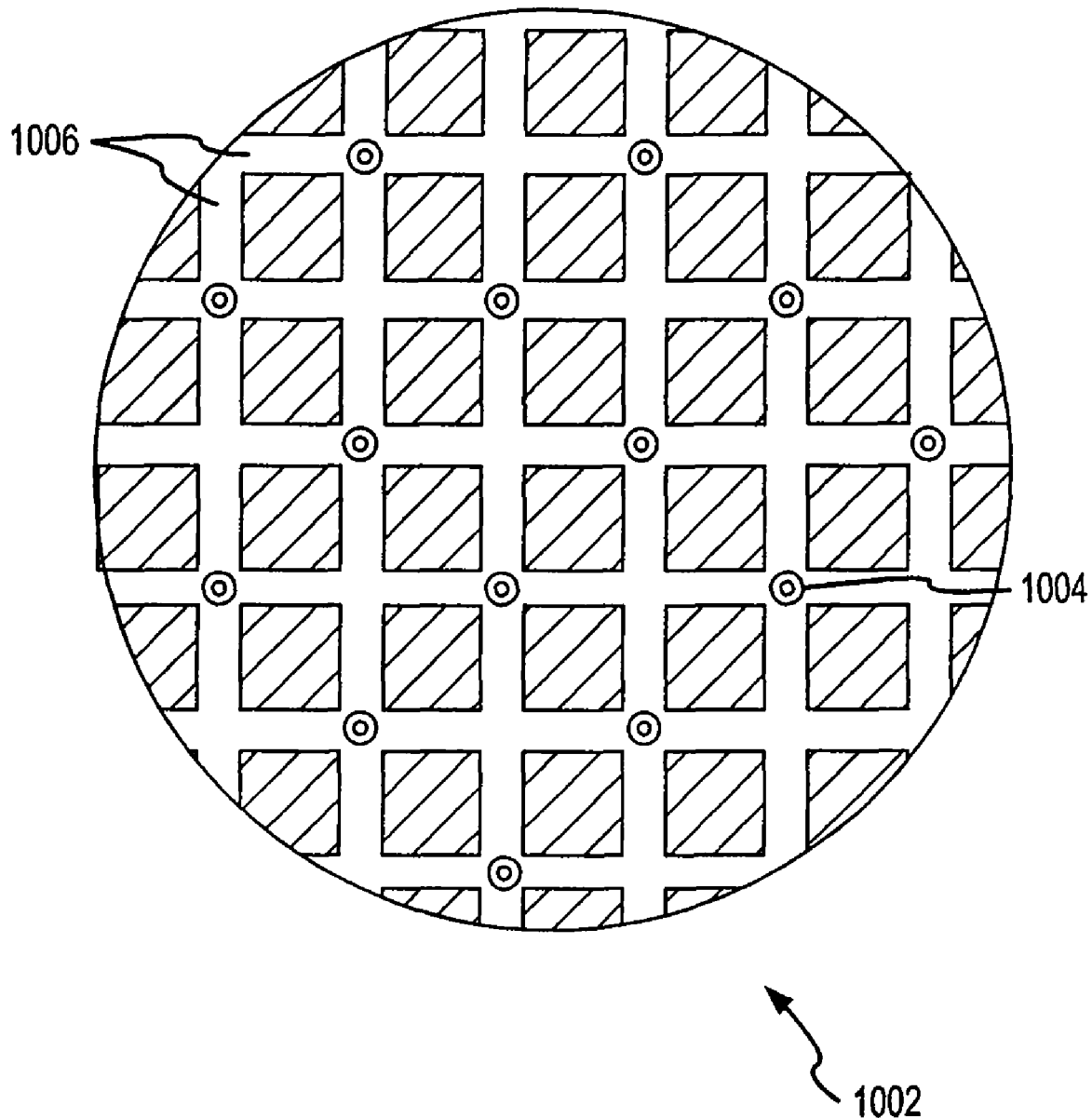
FIG. 9 illustrates a top plan view of an exemplary prior art polishing surface.

FIG. 9 illustrates a top view of an exemplary prior art polishing surface 1002. Polishing surface 1002 includes apertures 1004 extending through surface 1002. Apertures 1004 are suitably aligned with channels formed within a platen (e.g., platen 802), such that polishing solution may circulate through the platen and polishing surface 1002 as described above in connection with, for example, FIGS. 7, 8A, and 8B. Surface 1000 also includes grooves 1006. Grooves 1006 are configured to effect transportation of the polishing solution on polishing surface 1002 during a polishing process. Polishing surface 1002 may also be porous, further facilitating transportation of the polishing solution. In accordance with one exemplary embodiment of the invention, surface 1002 is formed of polyurethane, having a thickness of about 0.050 to about 0.080 inches, and grooves 1006 are formed, for example, using a gang saw, such that the grooves are about 0.015 to about 0.045 inches deep, with a pitch of about 0.2 inches and a width of about 0.15 to about 0.30 inches.

FIG. 10 illustrates a cross-sectional view of a polishing apparatus 1100 suitable for polishing a surface of a wafer in accordance with another exemplary embodiment of the invention. Apparatus 1100 includes, for example, a lower polish module 1102, including a platen 1104 and a polishing surface 1106 and an upper polish module 1108, including a body 1110 and a retaining ring 1112, which retains the wafer during polishing. Apparatus 1100 may also include a slurry distribution apparatus to supply a polishing fluid to a top surface of lower module 1102.

Upper module 1108 is configured to cause the wafer to rotate, orbit, translate, or a combination thereof and to retain the wafer. In addition, upper module 1108 is configured to apply a pressure to wafer 1114 in the direction of lower module 1102, as discussed above in reference to upper module 708. Lower module is generally configured to move a polishing surface by rotating platen 1104 about its axis.

Although apparatus 1100 may be used to polish wafers in accordance with the present invention, apparatus 1100 generally requires additional space compared to apparatus 700. In particular, the diameter of polishing surface 1106 is generally about twice the diameter of wafer 1114, whereas polishing surface 706 of lower module 702 is about the same size as the wafer.

In exemplary operation, a wafer 1114 surface is polished by moving wafer 1114 using upper module 1108, while simultaneously rotating lower polishing module 1102 and polishing surface 1106 attached thereto. In accordance with one exemplary embodiment of the invention, upper module moves wafer 1114 in both a rotational and a translational direction during the polishing process. In accordance with another embodiment, upper module 1108 orbits about an axis.

FIG. 11 illustrates a linear polishing apparatus 1200, suitable for use in a polishing station, in accordance with another embodiment of the invention. Apparatus 1200 includes a lower polishing module 1202, including a polishing surface 1204 attached to a belt 1206, and rollers 1208 and 1210 and an upper module 1212, which may be the same as upper module 708 or 1108.

To effect polishing, carrier 1212 and/or polishing surface 1204 move relative to each other. For example, polishing may be effected primarily by moving surface 1204 relative to the wafer surface while rotating the wafer about the carrier axis. A linear polishing apparatus suitable for use in connection with the present invention is described in European Patent Application No. EP 0 916 452 A2, published on May 19, 1999, the content of which is hereby incorporated by reference.

Figure 14:
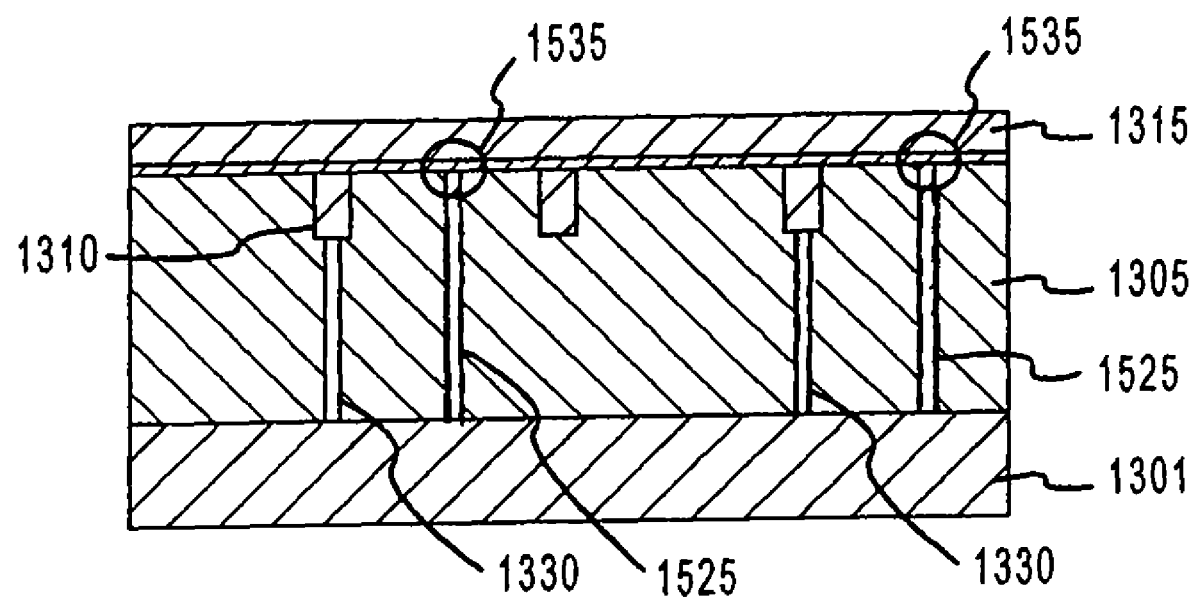
FIG. 14 is a partial side view of an exemplary apparatus, in accordance with one embodiment of the present invention, wherein a polishing pad is adapted to deliver slurry through the pad directly to the pad-wafer interface via slurry feed lines to the land areas of the pad-wafer interface.
Figure 15:
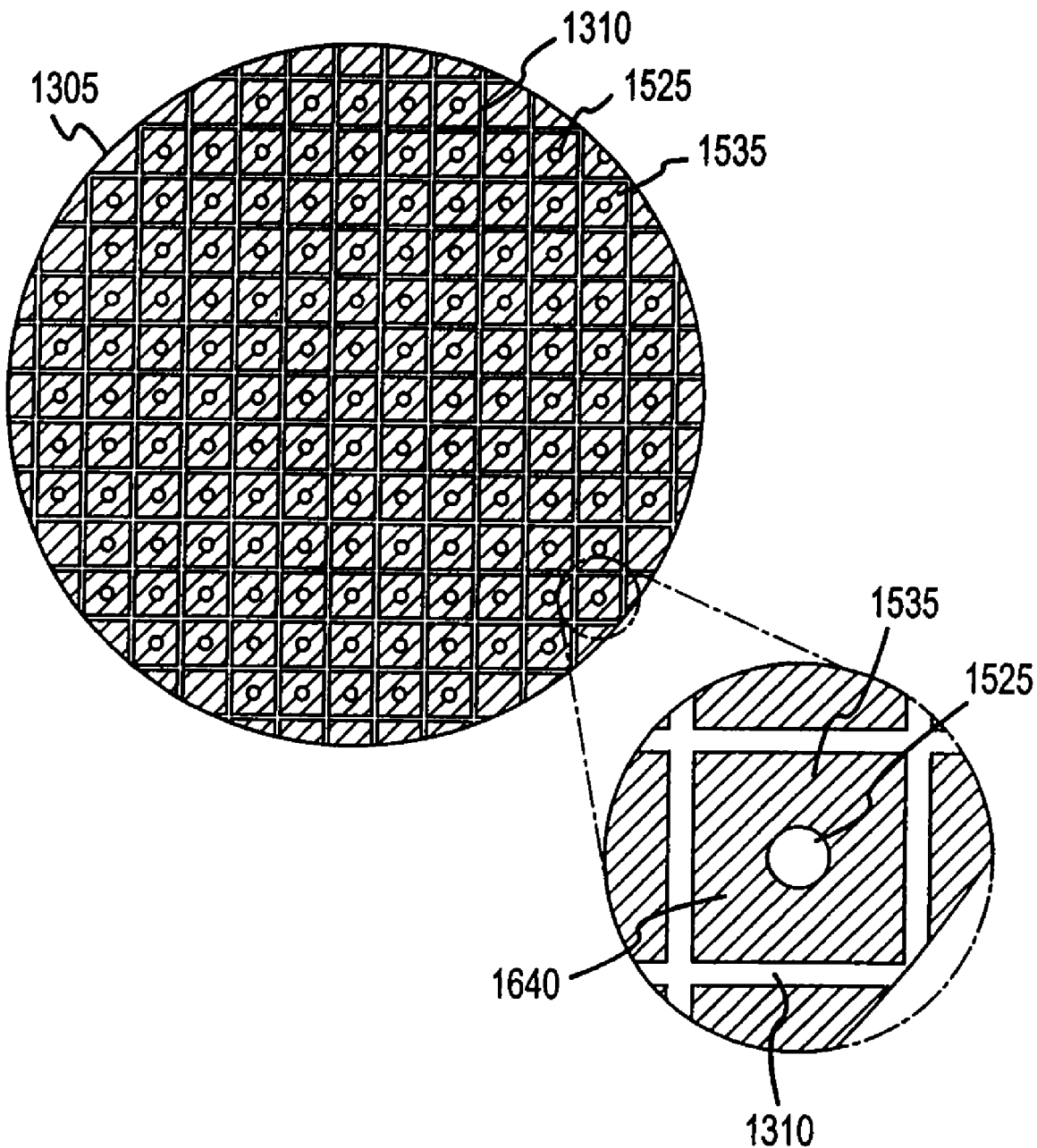
FIG. 15 is a plan view of an exemplary polishing pad, in accordance with one embodiment of the present invention, heaving a magnified view of an exemplary pad-wafer land area further depicting K-grooves in accordance with another embodiment of the present invention.

In accordance with one exemplary embodiment of the present invention, a new pad grooving pattern (e.g., '1×1 grooving') is disclosed which comprises one inch by one inch land space 1535 located between the X-Y grooves 1310 of, for example, a CMP polishing pad 1305 as generally depicted in FIGS. 14 and 15. These land areas 1535 are configured with slurry feed channels 1525 to deliver polishing slurry 1301 to the pad-wafer interface 1535 as shown in FIG. 14. Slurry delivery channels 1525 in the land areas 1535 generally provide the pad-wafer interface with a more efficient replenishment of fresh slurry 1301 as well as reduction of slurry channeling in the X-Y grooves 1310, thereby lowering the associated Cost-of-Ownership.

The primary polishing area of the pad (e.g., the surface area of the polishing pad which physically contacts the wafer substrate 1315 during polishing), in accordance with one exemplary embodiment, comprises rectilinear 1 inch by 1 inch land areas 1535 each having a slurry delivery channel 1525 positioned substantially through the center of the land area 1535. In an alternative exemplary embodiment, the land areas may be configured to have, for example, non-rectilinear, random, regular, irregular, functional, parametric, isotropic, anisotropic or chaotic geometries. In yet another exemplary embodiment of the present invention, not all land areas may be adapted or otherwise configured with slurry delivery channels 1525 to the land area 1535, and not all land areas 1535 having a slurry delivery channel 1525 may have the channel 1525 positioned substantially in the center-of-mass of the land area 1535.

As polishing slurry 1301 is delivered to the land areas 1535 of the polishing pad 1305, the slurry 1301 is transported and dispersed along K-grooves 1640 to the regions of the land area 1535 peripheral to the slurry channel opening 1330.

Figure 12:
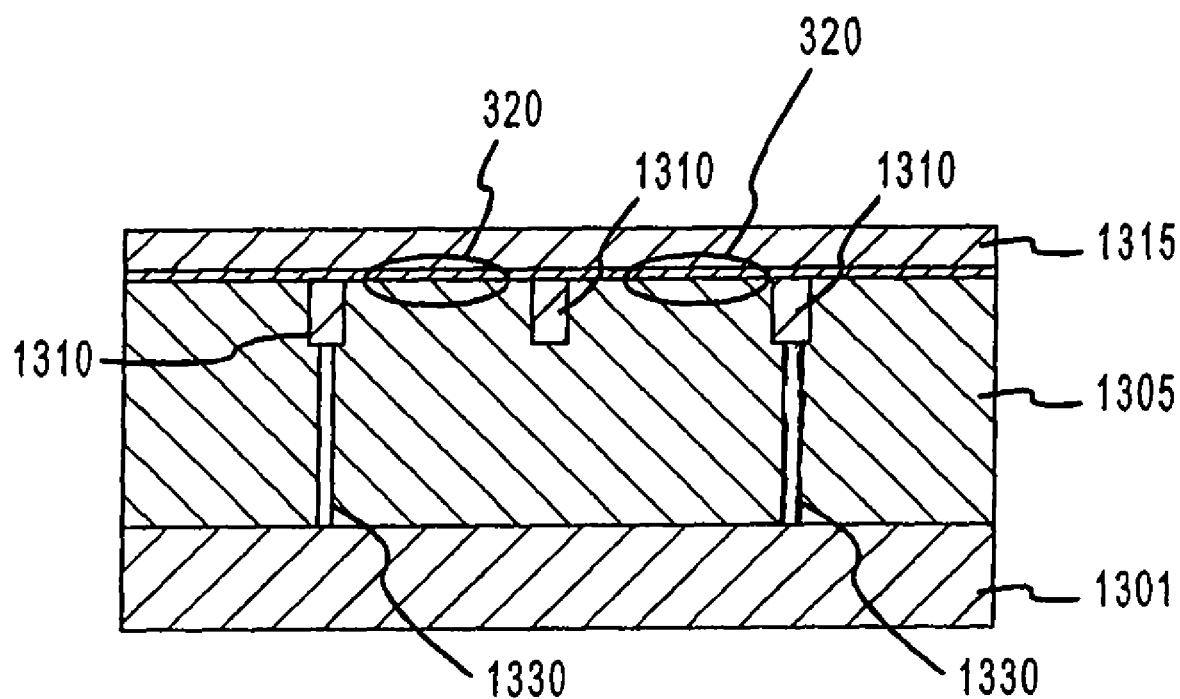
FIG. 12 is a partial side view depicting a prior art apparatus, wherein a polishing pad is configured to deliver slurry through the pad to the pad-wafer interface via slurry feed lines to the X-Y grooves.
Figure 13:
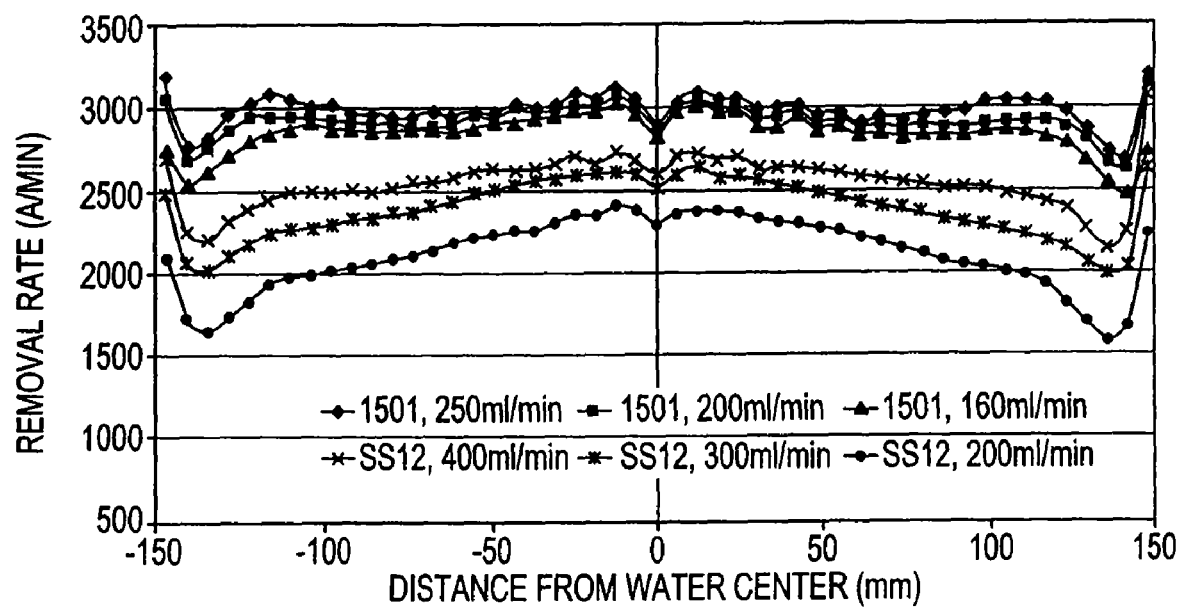
FIG. 13 is a graph depicting post-CMP semiconductor wafer planarization profile data obtained using 1501-50 and SS-12 slurries in a conventional 300 mm CMP process.

K-grooves 1640 are configured, in one exemplary embodiment, to run substantially diagonal to X-Y grooves 1310, as shown, for example, in FIG. 15. In one embodiment in accordance with the present invention, the K-grooves have a pitch of about 0.070 inches with, for example, three K-grooves on 0.25 inch lands and/or fourteen K-grooves on 1 inch lands. In an exemplary embodiment of the present invention, the X-Y grooves 1310 are suitably configured to serve as drain paths for removal of polishing by-products during the process, wherein spent slurry 1301 flows off of the land area 1535 into the X-Y grooves 1310 for subsequent removal. In an alternative exemplary embodiment, the X-Y grooves 1310 are themselves configured with slurry delivery channels 1330 (see FIG. 12), for example, to refresh the chemical reactivity of the spent slurry prior to: (1) removal of the slurry from the X-Y grooves; (2) recycling of the fortified waste slurry back through the land area delivery channels 1525; and/or (3) transport of the fortified waste slurry from the X-Y grooves 1310 to the land areas 1535 of the pad by mechanical action of the polishing process. The K-grooves 1640, in addition to providing for dispersal of slurry 1301 over the land areas 1535, also improve the retention time of the slurry 1301 on the pad surface during polishing and reduce the appearance of slow band response at the wafer edge, thereby increasing slurry usage efficiency and reducing the associated Cost-of-Ownership.

Figure 16:
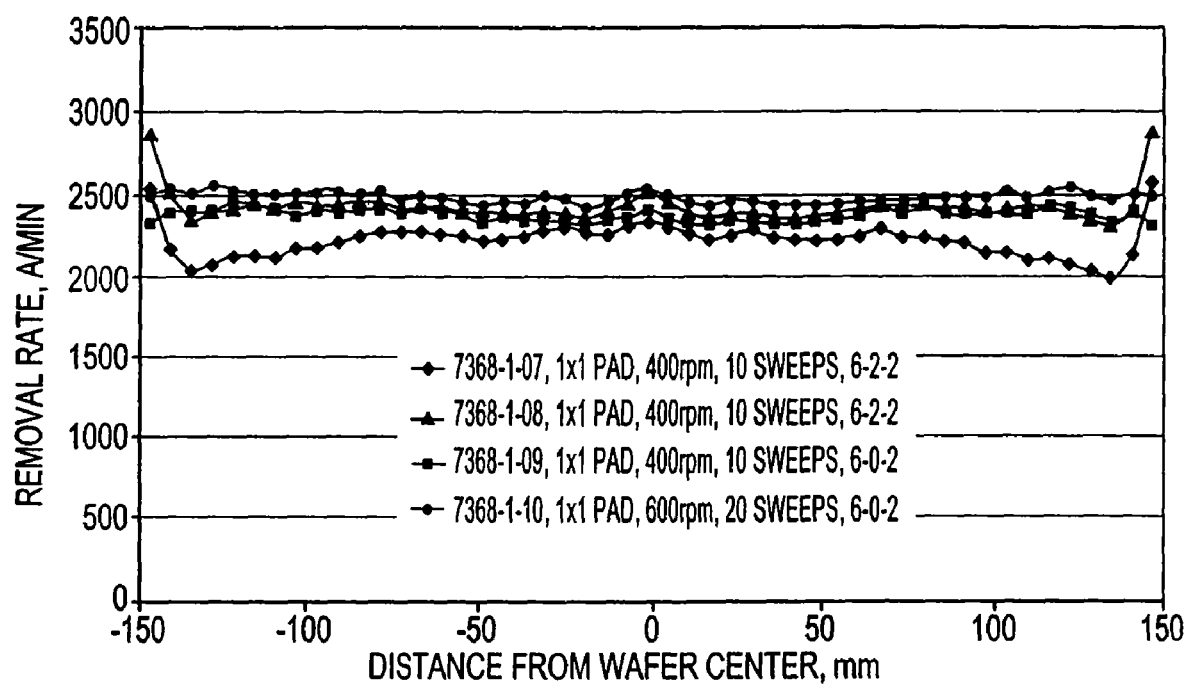
FIG. 16 is a graph depicting post-CMP semiconductor wafer planarization profile data obtained from semiconductor wafers polished with various CMP process parameters using an exemplary polishing pad in accordance with one embodiment of the present invention.

In accordance with one exemplary application, four semiconductor wafers were subjected to various CMP process procedures (e.g., orbital velocities, sweeps, etc.) with a 1×1 grooving polishing pad as describe above in accordance with the present invention. It was observed that polish non-uniformity ("NU") was significantly improved by changing the surface profile of the wafer edge in the slow band region as shown in FIG. 16, for example, from about 130 mm to 150 mm and from about −130 mm to −150 mm. As compared to these same polishing procedures having been performed with a conventional prior art polishing pad, the NU for an SS-12-based process with the new 1×1 grooving pad was reduced from ~5% (1) to ~2%. FIG. 16 shows the diameter profile scan data (with 3 mm edge exclusion) that was observed for wafers polished on a 1×1 pad in accordance with the present invention. The slow band region at the wafer edge was thereafter eliminated and a substantially planar profile across the entire wafer was achieved.

Figure 17:
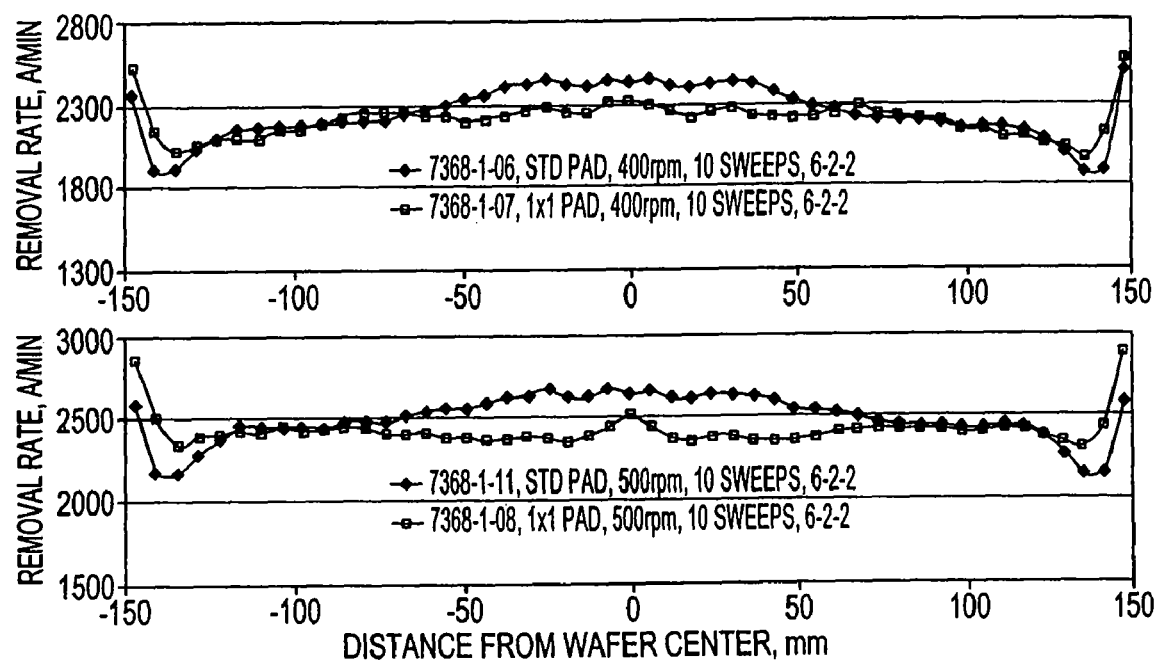
FIG. 17 is a graph depicting post-CMP semiconductor wafer planarization profile data comparing the performance of a conventional prior art polishing pad ('std pad') with an exemplary polishing pad ('1×1 pad') in accordance with one embodiment of the present invention.
Figure 18:
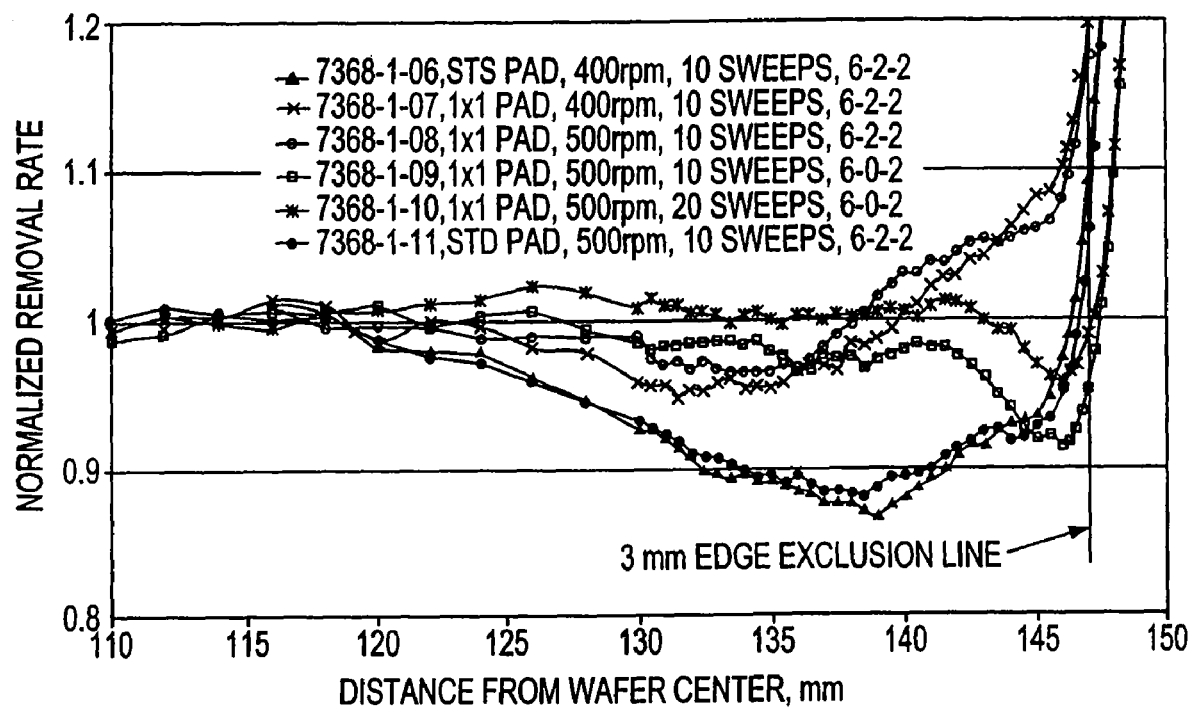
FIG. 18 is a graph depicting post-CMP semiconductor wafer planarization profile data corresponding to a normalization of the data shown in FIG. 17.
Figure 19:
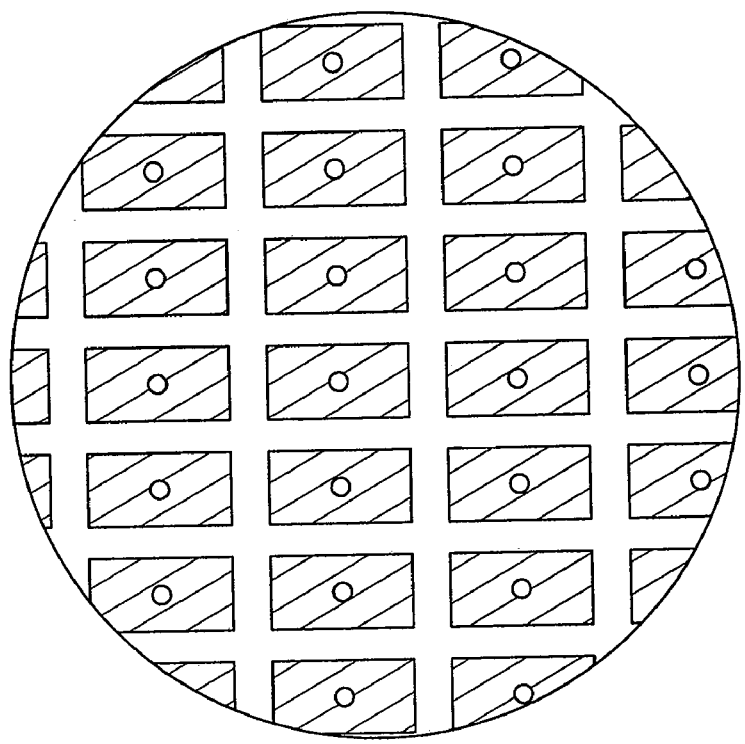
FIG. 19 is a top plane view of an exemplary polishing pad in accordance with one embodiment of the present invention.
Figure 20:
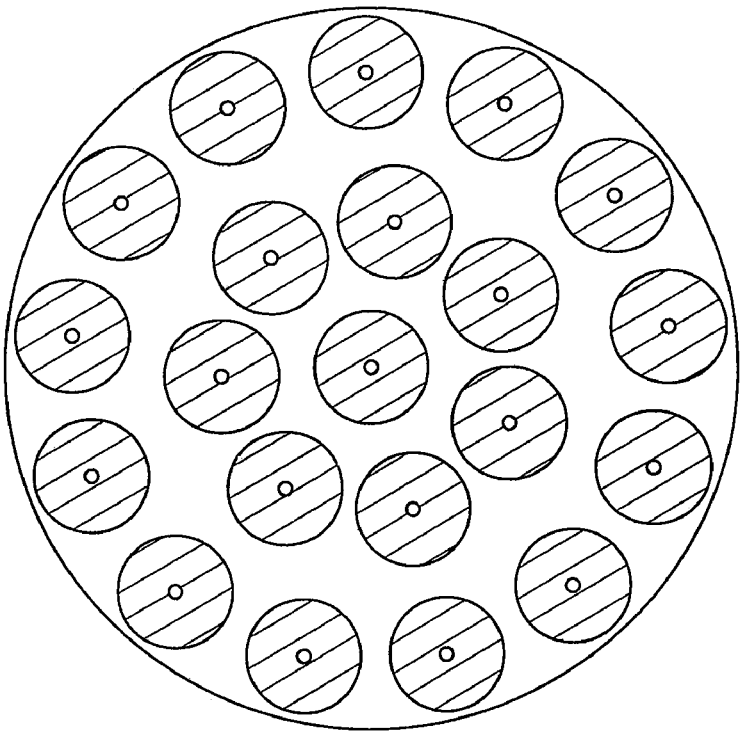
FIG. 20 is a top plane view of an exemplary polishing pad in accordance with one embodiment of the present invention.
Figure 21:
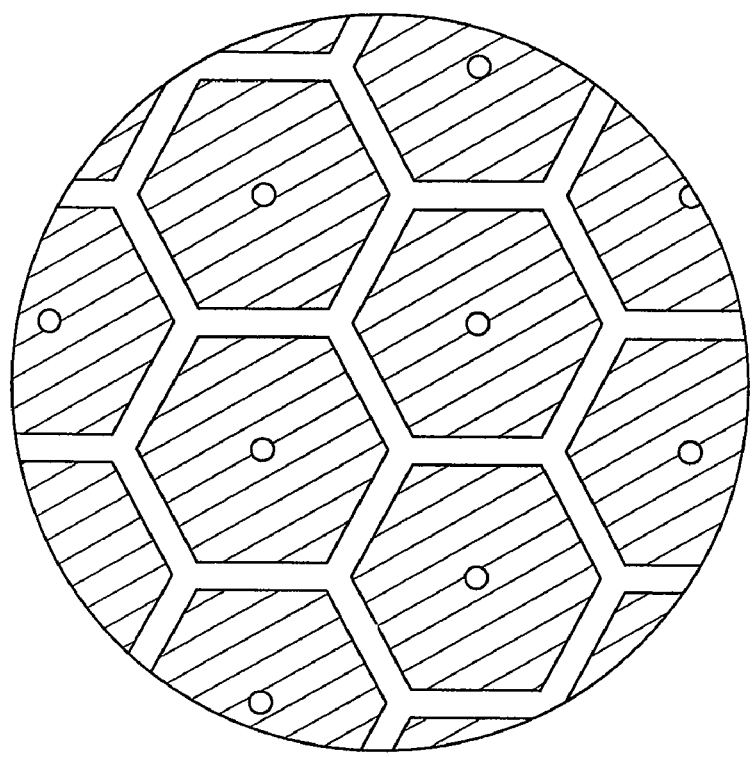
FIG. 21 is a top plane view of an exemplary polishing pad in accordance with one embodiment of the present invention.
Figure 22:
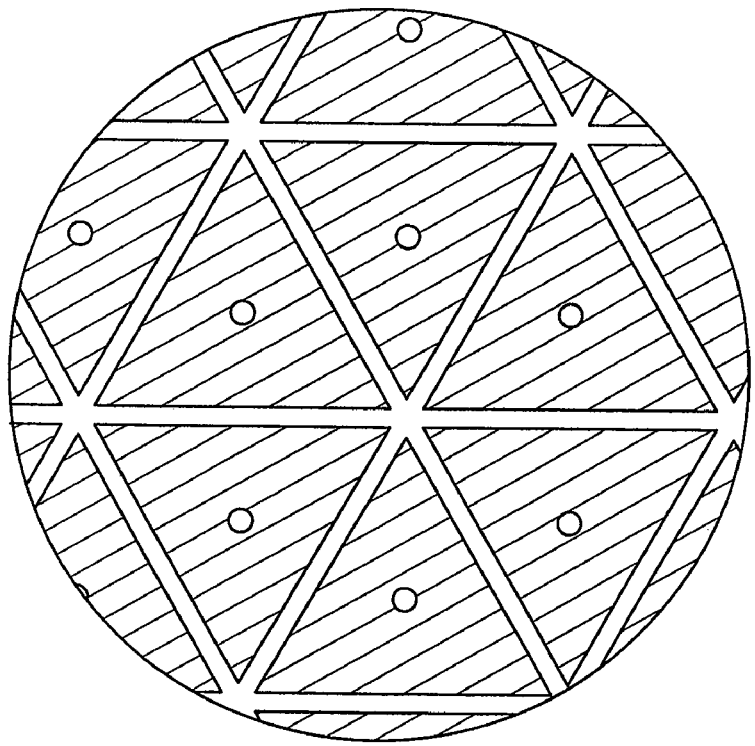
FIG. 22 is a top plane view of an exemplary polishing pad in accordance with one embodiment of the present invention.
Figure 23:
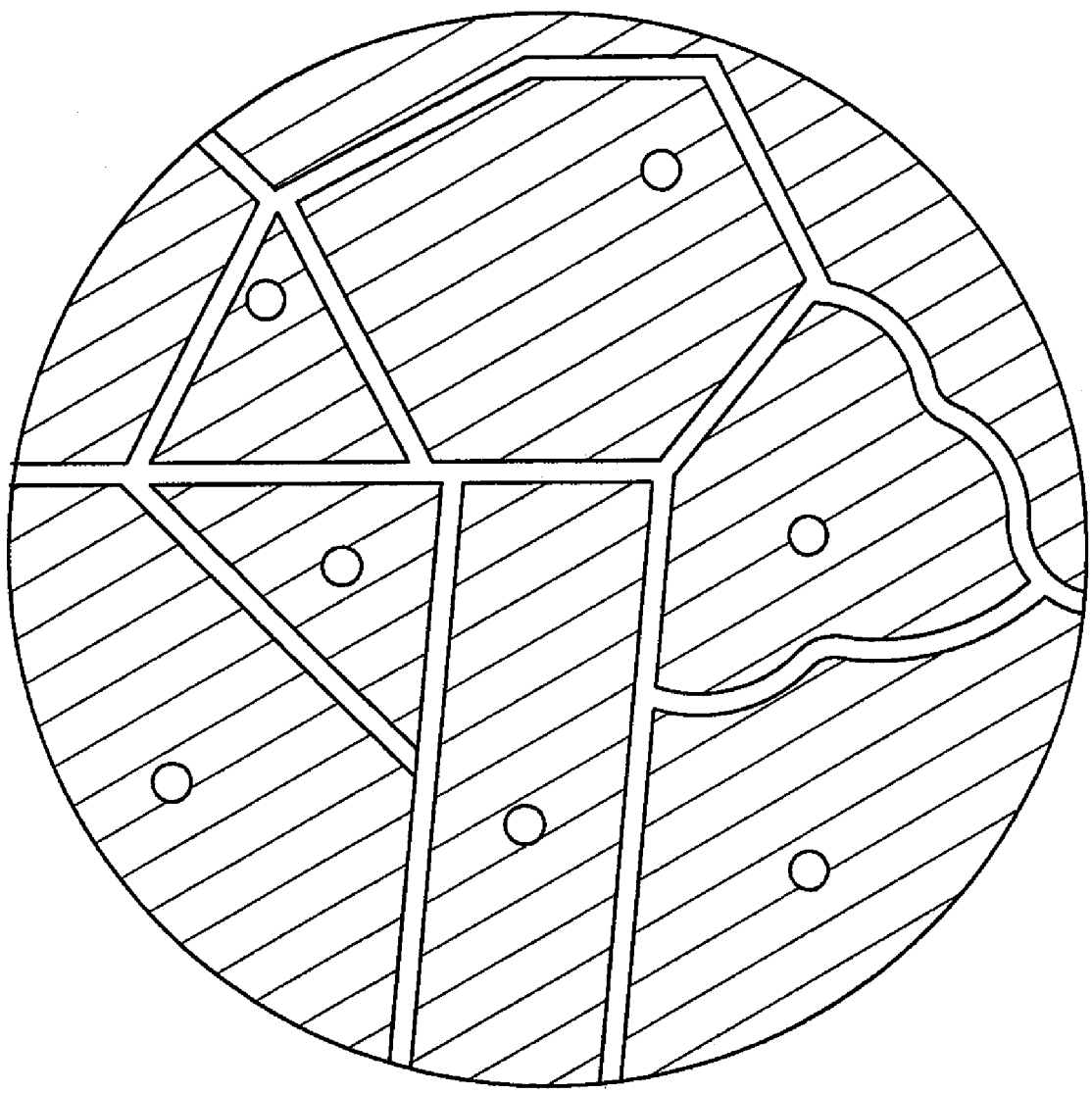
FIG. 23 is a top plane view of an exemplary polishing pad in accordance with one embodiment of the present invention.

FIGS. 17 and 18 show the edge effects by comparing a conventional prior art pad ('std pad') with a 1×1 grooving pad in accordance with the present invention. The removal rate (in Angstroms per minute) is plotted as a function of the absolute distance from the center of the wafer 1315. With the new 1×1 grooving pad, the 300 mm SS-12-based oxide process becomes feasible with excellent NU results, where the use of a conventional prior art polishing pad yields processed wafers exhibiting poor uniformity.

Still other exemplary embodiments of the present invention may include selective control of delivery paths and wafer zones by varying flow rates and chemical composition, in addition to point-of-use mixing. Slurry delivery through the land areas of the pad is introduced to supply fresher slurry ("fresh slurry" having substantially similar chemical composition to that of pre-polish slurry) to the pad-wafer interface. Slurry delivery to the grooves is less efficient in replenishing used slurry at the pad-wafer interface. By optimizing (i.e., via design-of-experiment) the number of slurry holes in the land areas and groove intersections as well as the flow rates in the same, a new mechanism is provided for controlling or otherwise influencing the slurry chemistry at the pad-wafer interface during polishing. By addressing the pad-wafer interface directly, this control is considered to be of a fundamental nature and provides a wider range of removal rates and selectivities. Moreover, these implementations may be applied to orbital, rotational, linear or any other method or system for polishing surfaces as previously described, now known or hereafter derived by those skilled in the art.

By addressing the pad-wafer interface 1535 directly, controlled delivery of slurry 1301 provides for a wider range of removal rates and selectivities. In Cu CMP, this is known to have a significant impact on Cu thinning, defectivity and corrosion. For example, the inventors have observed that delivery of slurry 1301 directly to the pad land areas 1535 in Cu CMP processes has a significant impact on Cu thinning, defectivity and corrosion. Moreover, the disclosed method of land area slurry delivery, in accordance with the present invention, may be integrated with multi-zone slurry delivery methods as well.

In the foregoing specification, the invention has been described with reference to specific embodiments. However, it will be appreciated that various modifications and changes may be made without departing from the scope of the present invention as set forth in the claims below. The specification and figures are to be regarded in an illustrative manner, rather than a restrictive one, and all such modifications are intended to be included within the scope of the present invention. Accordingly, the scope of the invention should be determined by the appended claims and their legal equivalents, rather than by merely the examples given above. For example, the steps recited in any of the method or process claims may be executed in any order and are not limited to the order presented in the claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises", "comprising", or any variation thereof, are intended to cover a non-exclusive inclusion, such that a process, method, article, or apparatus that comprises a list of elements does not include only those elements but may include other elements not expressly listed or inherent to such process, method, article, or apparatus. Other combinations and/or modifications of the above-described structures, arrangements, applications, proportions, elements, materials or components used in the practice of the present invention, in addition to those not specifically recited, may be varied or otherwise particularly adapted by those skilled in the art to specific environments, manufacturing or design parameters or other operating requirements without departing from the general principles of the same.

What is claimed is:

1. An apparatus for polishing an object comprising a polishing surface having unobstructed and continuous grooves disposed thereon which define a plurality of land areas between the grooves wherein the grooves have at least one of an unobstructed and continuous non-uniform pattern, pitch, and cross-sectional area across a diameter of the polishing surface and at least one of the land areas has a slurry channel extending therethrough, and wherein minor grooves are disposed within the plurality of land areas, the minor grooves having a smaller cross-sectional area than the unobstructed and continuous grooves defining the boundaries of the plurality of land areas, wherein the minor grooves have at least one of a non-uniform pattern, pitch, and cross-sectional area across at least one of the land areas.

2. The apparatus of claim 1 wherein the land areas are uniform across the polishing surface in at least one of shape and size.

3. The apparatus of claim 1 wherein at least one of a shape or a size of the land areas varies across a diameter of the polishing surface.

4. The apparatus of claim 1 wherein each of the land areas has a slurry channel extending therethrough.

5. The apparatus of claim 1 wherein the land areas comprise a square shape.

6. The apparatus of claim 1 wherein the land areas comprise a rectangular shape.

7. The apparatus of claim 1 wherein the land areas comprise a circular non-annular shape.

8. The apparatus of claim 1 wherein the land areas comprise a hexagonal shape.

9. The apparatus of claim 1 wherein the land areas comprise a triangular shape.

10. The apparatus of claim 1 wherein the land areas comprise random, irregular shapes.

11. The apparatus of claim 1 wherein the slurry channel is positioned within a center of the land area.

12. The apparatus of claim 1 wherein the position of the slurry channels within the land areas is varied.

13. The apparatus of claim 1 further comprising a slurry channel extending through at least one groove contained in the polishing surface.

14. The apparatus of claim 1 wherein the land areas comprise a surface area within a range of 1/8 square inch to 3 square inches.

15. The apparatus of claim 1 wherein at least some grooves intersect with one another at approximately a 90 degree angle.

16. The apparatus of claim 1 wherein at least some grooves intersect with one another at approximately a 60 degree angle.

17. The apparatus of claim 1 wherein at least some of the grooves intersect with one another at approximately a 30 degree angle.

18. An apparatus for polishing an object comprising a polishing surface having grooves disposed thereon which define a plurality of land areas between the grooves wherein there are minor grooves disposed within the land areas that have a smaller cross-sectional area than the grooves defining the boundaries of the land areas; and wherein at least one of the land areas has a slurry channel extending therethrough, wherein at least one of the pattern, pitch, or cross-sectional area of the minor grooves within a land area varies across a diameter of the polishing surface.

19. The apparatus of claim 18 wherein the minor grooves are uniform across the land areas.

20. The apparatus of claim 18 wherein the minor grooves have at least one of a non-uniform pattern, pitch, and cross-sectional area across at least one of the land areas.

21. The apparatus of claim 18 wherein the minor grooves are positioned substantially diagonal to the grooves that define the land areas.

22. The apparatus of claim 18 wherein at least some minor grooves intersect with one another at approximately a 90 degree angle.

23. The apparatus of claim 18 wherein at least some minor grooves intersect with one another at approximately a 60 degree angle.

24. The apparatus of claim 18 wherein at least some of the minor grooves intersect with one another at approximately a 30 degree angle.

25. The apparatus of claim 18 wherein a pitch of the minor grooves ranges between 1/16" to 1".

26. The apparatus of claim 18 wherein the slurry channel is positioned within one of the minor grooves within the land area.

* * * * *